(12) United States Patent
Hwang et al.

(10) Patent No.: US 9,691,782 B1
(45) Date of Patent: Jun. 27, 2017

(54) NON-VOLATILE MEMORY DEVICE

(71) Applicants: Chul-jin Hwang, Seongnam-si (KR); Bong-soon Lim, Seoul (KR); Ki-tae Park, Seongnam-si (KR)

(72) Inventors: Chul-jin Hwang, Seongnam-si (KR); Bong-soon Lim, Seoul (KR); Ki-tae Park, Seongnam-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/388,369

(22) Filed: Dec. 22, 2016

(30) Foreign Application Priority Data

Apr. 29, 2016 (KR) .................. 10-2016-0053533

(51) Int. Cl.
| H01L 27/115 | (2017.01) |
| H01L 27/11573 | (2017.01) |
| H01L 27/1157 | (2017.01) |
| H01L 27/11575 | (2017.01) |
| H01L 27/11582 | (2017.01) |
| H01L 27/02 | (2006.01) |

(52) U.S. Cl.
CPC .... *H01L 27/11573* (2013.01); *H01L 27/0266* (2013.01); *H01L 27/1157* (2013.01); *H01L 27/11575* (2013.01); *H01L 27/11582* (2013.01)

(58) Field of Classification Search
CPC ......... H01L 24/02; H01L 24/04; H01L 24/05; H01L 27/11293; H01L 27/11551
USPC ........................................ 257/773, 784, 786
See application file for complete search history.

(56) References Cited

U.S. PATENT DOCUMENTS

| 8,508,967 | B2 | 8/2013 | Yamazaki et al. |
| 8,531,901 | B2 | 9/2013 | Ogiwara et al. |
| 8,541,819 | B1 | 9/2013 | Or-Bach et al. |
| 9,048,224 | B2 | 6/2015 | Iguchi et al. |
| 9,093,129 | B2 | 7/2015 | Zhang |
| 9,117,526 | B2 | 8/2015 | Lai |
| 9,508,441 | B1 * | 11/2016 | Nam .................. G11C 16/10 |
| 2009/0303801 | A1 * | 12/2009 | Kim .................. B82Y 10/00 365/189.05 |
| 2011/0220987 | A1 * | 9/2011 | Tanaka ............ H01L 27/11575 257/324 |
| 2012/0108048 | A1 | 5/2012 | Lim et al. |

(Continued)

FOREIGN PATENT DOCUMENTS

| JP | 2012-059830 A | 3/2012 |
| KR | 10-2015-0122369 A | 11/2015 |

*Primary Examiner* — George Fourson, III
(74) *Attorney, Agent, or Firm* — Harness, Dickey & Pierce, P.L.C.

(57) ABSTRACT

A non-volatile memory device includes a substrate, a memory cell array on the substrate, a plurality of bonding pads, and a pad circuit. The memory cell array includes a plurality of gate conductive layers stacked on the substrate in a vertical direction and a plurality of channels penetrating into the plurality of gate conductive layers on an upper portion of the substrate. The plurality of bonding pads are on at least part of an upper portion of the memory cell array. The plurality of bonding pads are configured to electrically connect the non-volatile memory device to an external device. The pad circuit is between the substrate and the memory cell array. The pad circuit is electrically connected to at least one of the plurality of bonding pads.

20 Claims, 26 Drawing Sheets

(56) References Cited

U.S. PATENT DOCUMENTS

| | | | |
|---|---|---|---|
| 2013/0130468 A1* | 5/2013 | Higashitani | H01L 29/7926 438/382 |
| 2015/0129878 A1 | 5/2015 | Shin et al. | |
| 2015/0162342 A1 | 6/2015 | Lee et al. | |
| 2015/0243634 A1 | 8/2015 | Aritome | |
| 2015/0255386 A1* | 9/2015 | Lee | H01L 23/5226 257/774 |
| 2015/0303209 A1 | 10/2015 | Park et al. | |
| 2016/0163386 A1* | 6/2016 | Hwang | G11C 5/025 365/185.12 |
| 2016/0307910 A1* | 10/2016 | Son | H01L 27/0688 |
| 2016/0329340 A1* | 11/2016 | Hwang | H01L 21/30604 |
| 2016/0343450 A1* | 11/2016 | Lee | G11C 16/3459 |
| 2017/0040337 A1* | 2/2017 | Kim | H01L 27/11582 |

* cited by examiner

NON-VOLATILE MEMORY DEVICE

CROSS-REFERENCE TO RELATED APPLICATION

This application claims priority under 35 U.S.C. §119 to Korean Patent Application No. 10-2016-0053533, filed on Apr. 29, 2016, in the Korean Intellectual Property Office, the disclosure of which is incorporated herein in its entirety by reference.

BACKGROUND

Inventive concepts relate to a non-volatile memory device, and more particularly, to a non-volatile memory device and/or a method of manufacturing the non-volatile memory device.

Recently, as information communication devices become multi-functional, a larger-capacity and more highly integrated memory device may be produced. According to a reduction in memory cell size for the purpose of high integration, operation circuits and/or wiring structures, which are included in a memory device for operation and electrical connection of the memory device, have also become more complicated. Therefore, there is a demand for a memory device which exhibits excellent electrical properties while having improvement in a degree of integration.

SUMMARY

Inventive concepts provide a non-volatile memory device having excellent electrical characteristics and high integration and/or a method of manufacturing the non-volatile memory device.

According to an example embodiment of inventive concepts, a non-volatile memory device may include a substrate, a memory cell array on the substrate, the memory cell array including a plurality of gate conductive layers stacked on the substrate in a vertical direction and a plurality of channels penetrating into the plurality of gate conductive layers and on an upper portion of the substrate, a plurality of bonding pads on at least part of an upper portion of the memory cell array, the plurality of bonding pads being configured to electrically connect the non-volatile memory device to an external device, and a pad circuit between the substrate and the memory cell array, the pad circuit being electrically connected to at least one of the plurality of bonding pads.

According to another example embodiment of inventive concepts, a non-volatile memory device may include a substrate, a first memory cell array on an upper portion of the substrate, a second memory cell array on the upper portion of the substrate and adjacent to the first memory cell array, a plurality of bonding pads on at least part of an upper portion of at least one of the first memory cell array and the second memory cell array, the plurality of bonding pads being configured to electrically connect the non-volatile memory device to an external device, a first pad circuit between the substrate and the first memory cell array, a second pad circuit between the substrate and the second memory cell array, and a plurality of connection pads electrically connecting at least one of the first pad circuit and the second pad circuit to at least one of the plurality of bonding pads, at least one of the plurality of connection pads being on at least a part of the first memory cell array and a part of the second memory cell array.

According to another example embodiment of inventive concepts, a non-volatile memory device may include a substrate; a memory cell array on the substrate, the memory cell array including a plurality of gate conductive layers stacked on top of each other on a semiconductor layer and a plurality of channels penetrating the plurality of gate conductive layers towards the semiconductor layer in a vertical direction; a plurality of bonding pads on the substrate over at least part of an upper portion of the memory cell array; and a pad circuit between the substrate and the memory cell array, the pad circuit being electrically connected to at least one of the plurality of bonding pads.

BRIEF DESCRIPTION OF THE DRAWINGS

Example embodiments of inventive concepts will be more clearly understood from the following detailed description taken in conjunction with the accompanying drawings in which.

DETAILED DESCRIPTION OF EXAMPLE EMBODIMENTS

Figure 1:
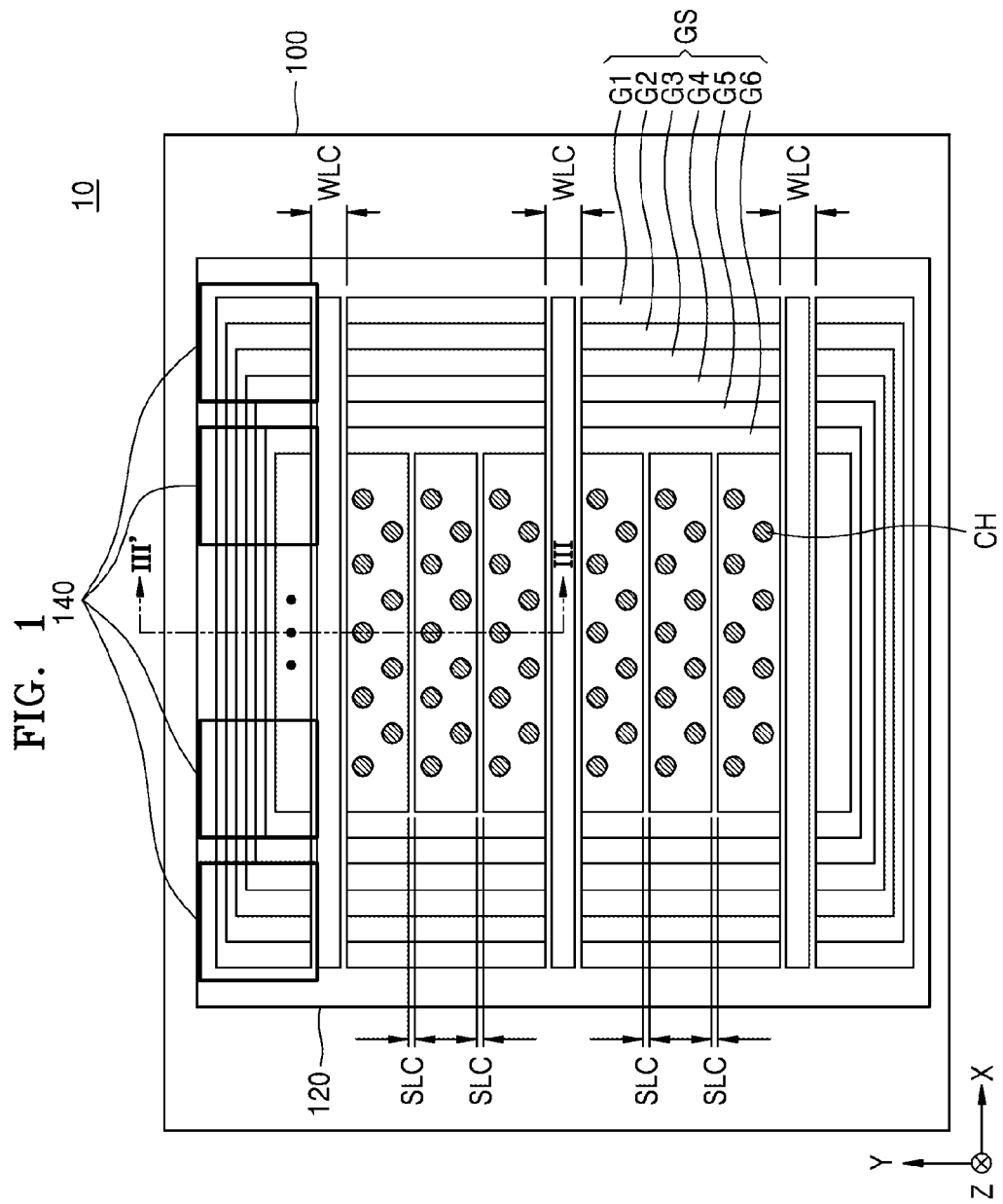
FIGS. 1 and 2 are layout diagrams of a memory device according to some example embodiments.
Figure 2:
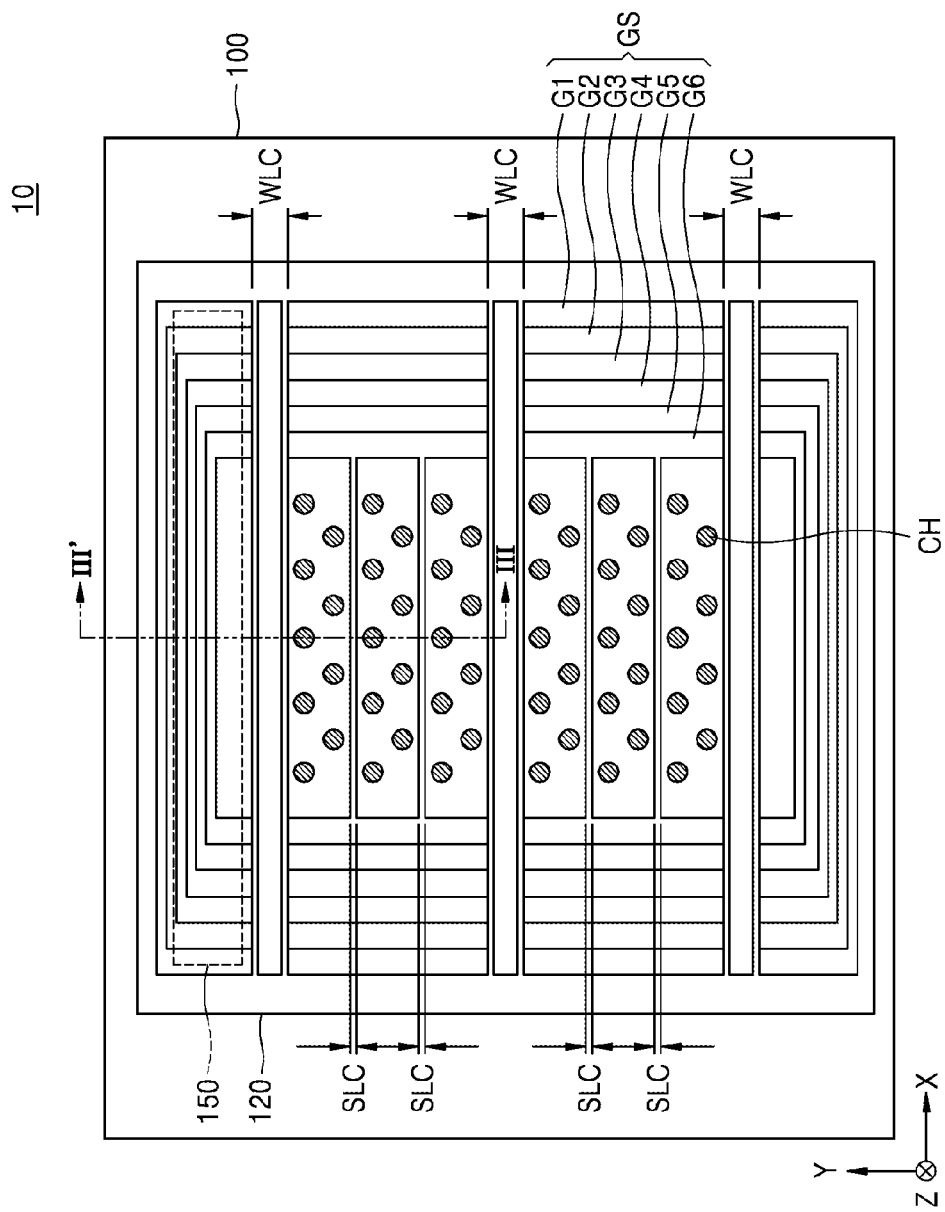
Figure 3:
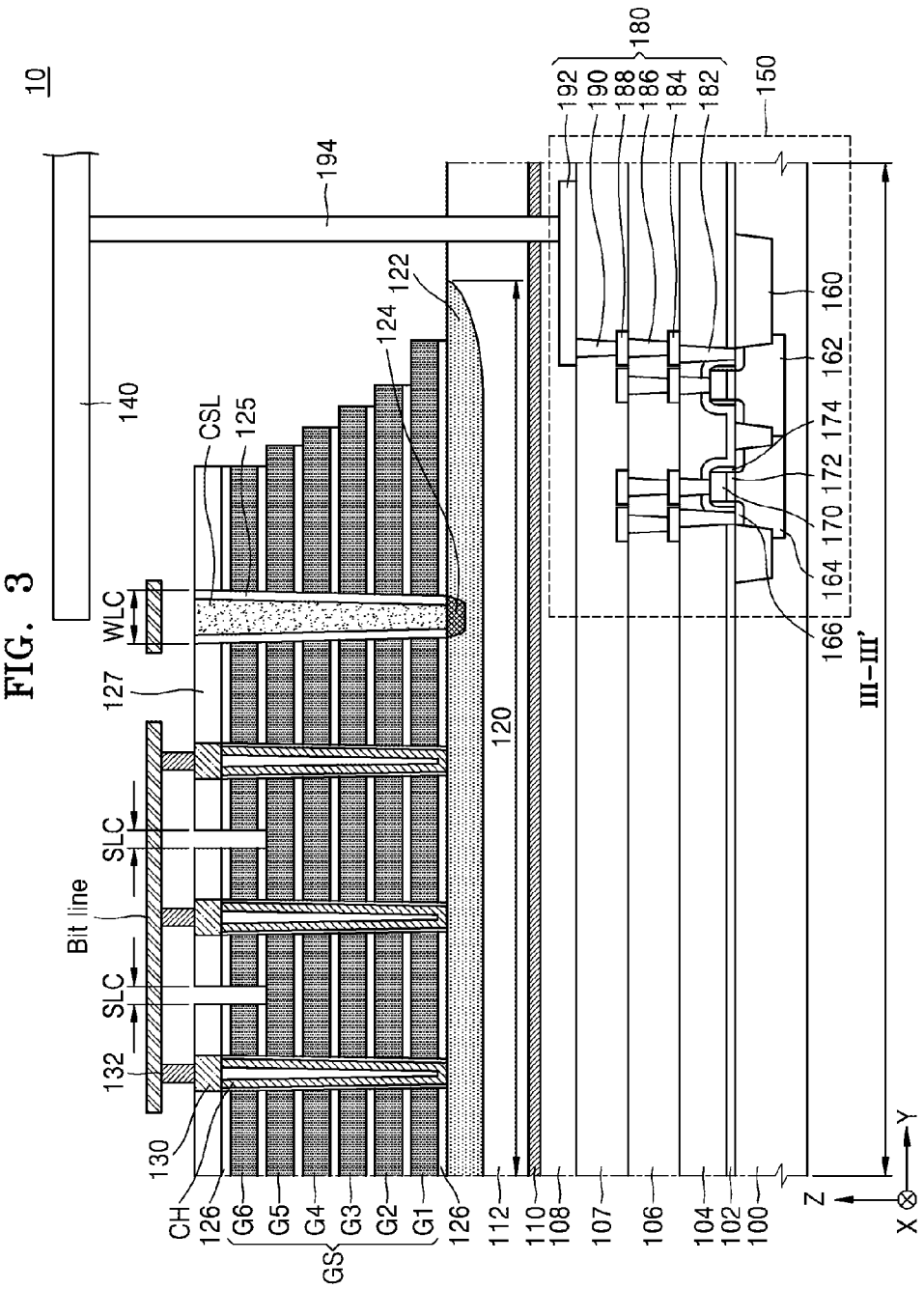
FIG. 3 is a cross-sectional view taken from a line III-III' of FIGS. 1 and 2.

FIGS. 1 and 2 are layout diagrams of a memory device 10 according to some example embodiments. FIG. 3 is a cross-sectional view taken from a line III-III' of FIGS. 1 and 2.

Referring to FIG. 1, the memory device 10 may include a substrate 100, a memory cell array 120, and a plurality of bonding pads 140.

The substrate 100 may have a main surface extending in a first direction (x and y directions). In some example embodiments, the substrate 100 may include a semiconductor such as Si, Ge, or SiGe. In some example embodiments, the substrate 100 may include a polysilicon substrate, a silicon-on-insulator (SOI) substrate, or a germanium-on-insulator (GeOI) substrate.

Figure 5:
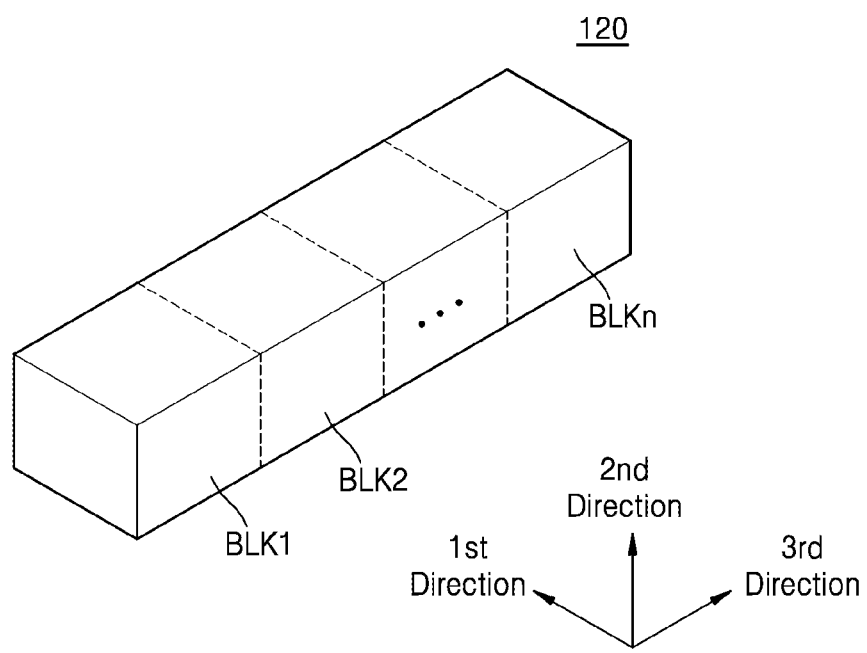
FIG. 5 is a perspective view of a memory cell array according to an example embodiment.
Figure 6:
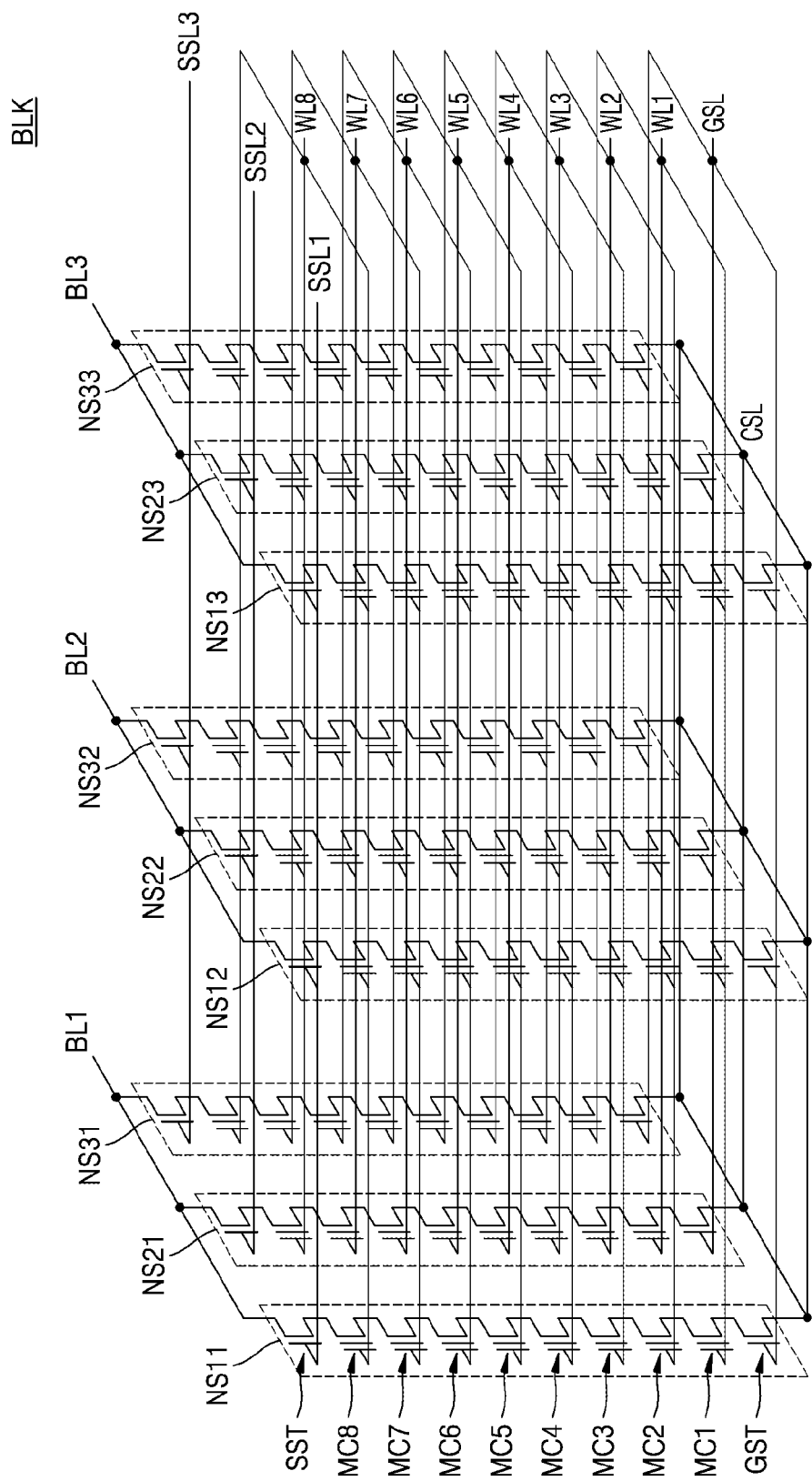
FIG. 6 is a circuit diagram of a memory block of FIG. 5.

The memory cell array 120 may have a vertical stack structure. In more detail, the memory cell array 120 may be configured by forming a plurality of channels CH and gate conductive layers GS in the substrate 100. The memory cell array 120 may have a circuit configuration as shown in FIGS. 5 and 6.

A plurality of gate electrodes G1 through G6 constituting the gate conductive layers GS may be referred to as word lines, string select lines, and/or ground select lines, etc. The plurality of gate electrodes G1 through G6 may be stacked in a direction (z direction) perpendicular to the substrate 100. As shown in FIG. 3, a gate insulating layer 121 may be disposed on a lower or upper portion of each of the plurality of gate electrodes G1 through G6. Respective areas of gate electrodes G1 through G6 may decrease in a direction away from the substrate 100. Thus, as shown in FIG. 3, an edge region of the gate conductive layers GS may have a shape of step. A contact (not shown) may be formed in the edge region of the gate conductive layers GS. The plurality of gate electrodes G1 through G6 may be connected to a wiring line through the contact.

Meanwhile, the gate conductive layers GS may be separated by a word line cut region WLC. For convenience of description, the gate conductive layers GS include the first through sixth gate electrodes G1 through G6 but are not limited thereto. The number of gate electrodes may vary according to a structure of cell strings included in the memory cell array 120.

A pad circuit 150 may be disposed on the substrate 100, in more detail, between the substrate 100 and the memory cell array 120. That is, the memory cell array 120 may be disposed on an upper portion of the pad circuit 150 disposed on the substrate 100. This structure may be referred to as a cell over peripheral (COP) structure. The COP structure may effectively reduce an area occupying a surface perpendicular to a stack direction, thereby increasing the number of memory cells integrated into the memory device 10.

An active region may be defined by a device isolation layer 160 in the pad circuit 150 of the substrate 100. A P type well 162 for the pad circuit 150 and an N type well 164 for the pad circuit 150 may be formed in the active region of the substrate 100. An MOS transistor may be formed on the P type well 162 and the N type well 164. Each of a plurality of transistors may include a gate 170, a gate insulating layer 172, and a source/drain region 166. Both side walls of the gate 170 may be covered by an insulating spacer 174. An etching stop layer 102 may be formed on the gate 170 and the insulating spacer 174. The etching stop layer 102 may include an insulating material such as a silicon nitride, a silicon oxynitride, etc.

A plurality of interlayer insulating layers 104, 106, 107, and 108 may be sequentially stacked on the etching stop layer 102. The plurality of interlayer insulating layers 104, 106, 107, and 108 may include a silicon nitride, a silicon oxynitride, etc.

The plurality of transistors may be electrically connected to a multilayer wiring structure 180. The multilayer wiring structure 180 may be insulated from each other by the plurality of interlayer insulating layers 104, 106, 107, and 108.

The multilayer wiring structure 180 may include a first contact 182, a first wiring layer 184, a second contact 186, a second wiring layer 188, a third contact 190, and a third wiring layer 192 that are sequentially stacked on the substrate 100 and are electrically connected to each other. In some example embodiments, the first wiring layer 184 through the third wiring layer 192 may include metal, a conductive metal nitride, metal silicide, or a combination of these. For example, the first wiring layer 184 through the third wiring layer 192 may include tungsten, molybdenum, titanium, cobalt, tantalum, nickel, tungsten silicide, titanium silicide, cobalt silicide, tantalum silicide, nickel silicide, etc.

The multilayer wiring layer 180 may include a triple layer wiring structure including the first wiring layer 184 through the third wiring layer 192, but inventive concepts are not limited thereto. For example, the multilayer wiring structure 180 may have a four or more layer multilayer wiring structure according to a layout of the pad circuit 150 and a type and an arrangement of the gate 170. In the multilayer wiring structure 180 of FIG. 3, the third wiring layer 192 may be regarded as an uppermost wiring layer among wiring layers configuring the multilayer wiring structure 180. The fourth interlayer insulating layer 108 among the plurality of interlayer insulating layers 104, 106, 107, and 108 may be regarded as an uppermost interlayer insulating layer covering the third wiring layer 192 that is an uppermost wiring layer.

The plurality of channels CH may penetrate into the plurality of gate electrodes G1 through G6 and may be connected to the first semiconductor layer 112. The first semiconductor layer 112 may be formed by using polysilicon doped with first impurities through a chemical vapor deposition process, an atomic layer deposition process, a physical vapor deposition process, etc.

The plurality of channels CH may be electrically connected to the pad circuit 150 disposed in a lower portion of the first semiconductor layer 112 through a connection with the first semiconductor layer 112. In an example embodiment, the plurality of channels CH may be connected to the pad circuit 150 through peripheral circuits. Although not shown, word line cuts extending in the first direction (x direction) or the second direction (y direction) may be formed between the plurality of channels CH. In a 3-dimensional (3D) memory cell array, at least one physical level of memory cell arrays having a circuit formed on a substrate (or a semiconductor layer) may be monolithically formed. The term "monolithically" means that layers of each of levels are stacked directly on layers of a lower level.

Referring to FIG. 3, a common source line CSL may extend in a first direction and may be formed in the word line cut WLC. A common source line spacer 125 including an insulating material may be formed in both side walls of the common source line CSL and may prevent an electrical connection between the common source line CSL and the gate conductive layers GS. A common source region 124 may extend in an extension direction (x direction) of the word line cut region WLC and may be formed in a well region 122 of the substrate 100. The common source region 124 may be an impurity region doped with n type impurities at a high concentration. The well region 122 and the common source region 124 may form a p-n junction diode. The common source region 124 may function as a source region supplying current to vertical memory cells.

The channels CH may penetrate into the gate conductive layers GS and the insulating layer 126 and may extend in a third direction (z direction of FIG. 3) perpendicular to an upper surface of the substrate 100 so that bottom surfaces of the channels CH may contact the upper surface of the substrate 100. The channels CH may be spaced apart from each other by a desired (and/or alternatively predetermined) space in the first and second directions.

In some example embodiments, the channels CH may include polysilicon doped with impurities or may include polysilicon that is not doped with impurities. The channels CH may be formed in the shape of a cup (or the shape of a cylinder with a closed bottom) extending in a vertical direction.

The memory device 10 may be electrically connected to an external device through the bonding pads 140.

According to an example embodiment, the bonding pads 140 may be disposed on at least part of an upper portion of the memory cell array 120. In other words, the bonding pads 140 may overlap with at least a part of the memory cell array 120 in the vertical direction.

The part of the memory cell array 120 that overlaps with the bonding pads 140 in the vertical direction may be at least part of an upper portion of an edge region of the memory cell array 120 in which the channels CH are not disposed. In an example embodiment, the bonding pads 140 may overlap with the edge region of the memory cell array 120. In an example embodiment, the bonding pads 140 may at least part of an upper portion of a region of the memory cell array 120 having one or more dummy channel holes. However, inventive concepts are not limited thereto.

Referring to FIG. 1, an edge region of the memory cell array 120 that is separated from other regions thereof by the word line cut WLC and at least some of the bonding pads 140 may overlap. No electrical signal may be applied to the edge region. In FIG. 1, only an edge region of an upper portion of the memory cell array 120 overlaps with the bonding pads 140, but inventive concepts are not limited thereto.

Referring to FIGS. 2 and 3, the memory device 10 may include the pad circuit 150 formed on the substrate 100 and the memory cell array 120 formed on an upper portion of the substrate 100. The memory device 100 may further include an insulating thin film 110 between the pad circuit 150 and the memory cell array 120.

The pad circuit 150 may include an electrostatic discharge (ESD) circuit, a pull-up/pull-down driver, a data input/output (I/O) circuit, etc.

The pad circuit 150 may be electrically connected to the bonding pads 140 through a plurality of bonding pad contacts 194 that penetrate into some of the first semiconductor layer 112, the insulating thin film 110, and the interlayer insulating layer 108. The memory cell array 120 may be formed above the pad circuit 150 in the memory device 10. Such a circuit structure of the memory device 10 may be referred to as a COP circuit structure. The bonding pad contacts 194 may include a metal material. Examples of the metal material used as the bonding pad contacts 194 may include W, Au, Ag, Cu, Al, TiAlN, WN, Ir, Pt, PD, Ru, Zr, Rh, Ni, Co, Cr, Sn, Zn, etc. The bonding pad contacts 194 may include the metal material having rigidity suitable for a chemical and mechanical polishing process. For example, the bonding pad contacts 194 may include tungsten. The bonding pad contacts 194 may further include a barrier metal layer. The bonding pad contacts 194 may have a flat upper surface.

The bonding pads 140 may include a material different from metal included in the bonding pad contacts 194. The bonding pads 140 may include a material having lower resistance than that of the metal included in the bonding pad contacts 194. For example, when the bonding pad contacts 194 include tungsten, the bonding pads 140 may include aluminum or an aluminum alloy.

Figure 4:
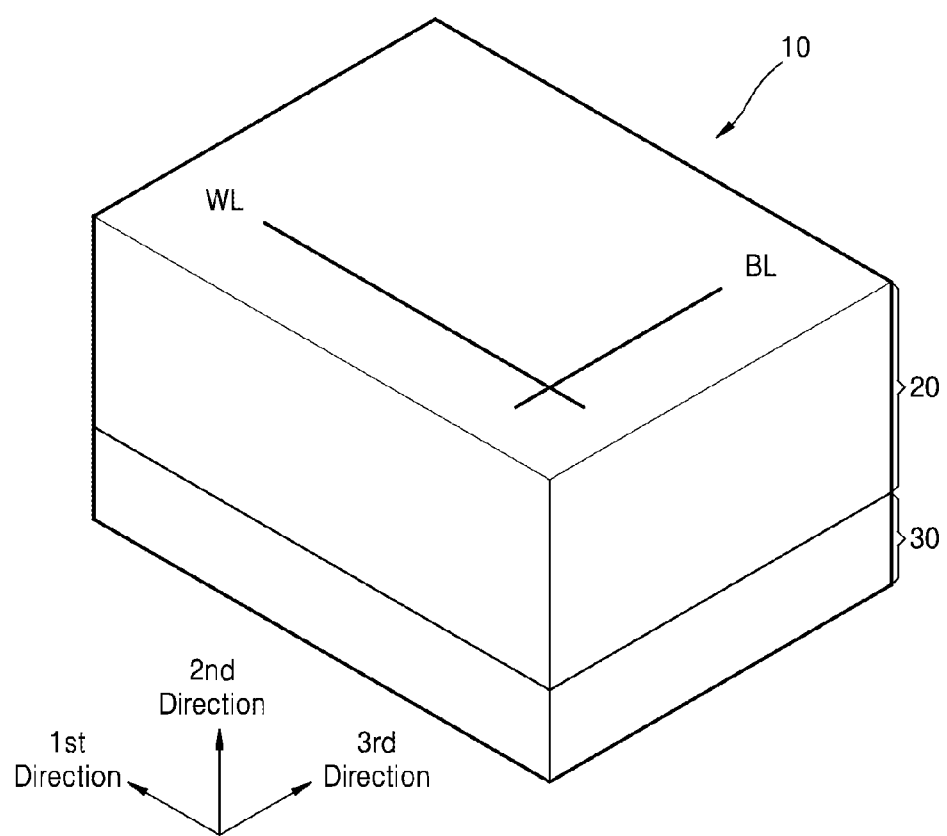
FIG. 4 is a schematic diagram of a structure of the memory device of FIG. 1 according to an example embodiment.

FIG. 4 is a schematic diagram of a structure of the memory device 10 of FIG. 1 according to an example embodiment. As described with reference to FIGS. 1, 3, and 4, the memory device 10 may include the memory cell array 120 and the pad circuit 150 that are may be formed through a semiconductor manufacturing process. The semiconductor manufacturing process will be described in detail with reference to FIGS. 10 through 18.

Referring to FIG. 4, the memory device 10 may include a first region layer 20 and a second region layer 30. The first region layer 20 may be stacked on the second region layer 30 in a third direction. According to an example embodiment, the memory cell array 120 of FIGS. 1 and 3 may be formed in the first region layer 20. The pad circuit 150 may be formed in the second region layer 30. That is, the second region layer 30 may include a substrate and may form semiconductor devices such as a transistor and a pattern for wiring the semiconductor devices on the substrate, thereby forming circuits, for example, an ESD circuit, a pull-up/pull-down driver, a data input/output (I/O) circuit, etc. in the second region layer 30.

After the circuits are formed in the second region layer 30, the first region layer 20 including the memory cell array 120 may be formed, and patterns for electrically connecting the memory cell array 120 and the circuits formed in the second region layer 30 may be formed. Accordingly, the memory device 10 may have a structure in which the memory cell array 120 and the pad circuit 150 are disposed in a stack direction (a third direction). Circuits excluding the memory cell array 120 may be disposed below the memory cell array, and thus the structure may effectively reduce an area occupying a surface perpendicular to the stack direction, thereby increasing the number of memory cells integrated into the memory device 10.

As shown in FIG. 4, a plurality of word lines WL may extend in a first direction perpendicular to the stack direction (the third direction), and a plurality of bit lines BL may also extend in a second direction perpendicular to the stack direction (the third direction) in the first region layer 20 in which the memory cell array 120 is formed. Memory cells included in the memory cell array 120 may be accessed by the plurality of word lines WL and the plurality of bit lines BL. The plurality of word lines WL and the plurality of bit lines BL may be electrically connected to the circuits formed in the second region layer 30, for example, the ESD circuit, the pull-up/pull-down driver, and the data input/output (I/O) circuit.

Although not shown in FIG. 4, a plurality of bonding pads may be disposed for an electrical connection with an external device of the memory device 10. For example, a plurality of pads for a command signal CMD, an address signal ADDR, and a control signal CTRL that are received from the external device of the memory device 10 (for example, a memory controller) may be disposed, and the plurality of bonding pads for inputting and outputting data DATA may be disposed.

The bonding pads may be disposed on an upper portion of a part of the memory cell array 120 and may overlap with the pad circuit 50 in a vertical direction (the third direction), thereby decreasing an area of the memory device 10, i.e., an area on a plane perpendicular to the third direction, and improving integration of the memory device 10. Furthermore, the bonding pads may be disposed on an upper portion of the memory cell array 120, thereby reducing a size of a chip including the memory device 10.

A memory cell array configured as a first gate structure of FIG. 1 and a plurality of memory blocks included in the memory cell array will be described with reference to FIGS. 5 and 6 below.

FIG. 5 is a perspective view of the memory cell array 120 according to an example embodiment.

Referring to FIG. 5, the memory cell array 120 may include a plurality of memory blocks BLK1~BLKn. Each memory block BLK may have a 3-dimensional structure (or a vertical structure). In an example embodiment, each memory block BLK may include structures extending along a plurality of directions (x, y, and z directions) corresponding to a 3D. For example, each memory block BLK may include a plurality of NAND cell strings extending along the z direction. In other words, each memory block BLK may include the NAND cell strings vertically arranged such that one memory cell is located on another memory cell. In this regard, at least one of memory cells may include a charge trap layer.

Each of the NAND cell strings may be connected to the bit line BL, a string select line SSL, a ground select line GSL, the word lines WL, and the common source line CSL. That is, each memory block BLK may be connected to a plurality of bit lines BL, a plurality of string select lines SSL, a plurality of ground select lines GSL, a plurality of word lines WL, and a plurality of common source lines CSL. The memory blocks BLK1~BLKn will be described in more detail with reference to FIG. 6.

FIG. 6 is a circuit diagram of an example of the memory block BLK of FIG. 5.

Referring to FIG. 6, the memory block BLK may be a NAND flash memory of a vertical structure. Each of the memory blocks BLK1~BLKn shown in FIG. 5 may be realized as in FIG. 6. The memory block BLK may include a plurality of NAND strings NS11 to NS33, a plurality of word lines WL1 to WL8, a plurality of bit lines BL1 to BL3, a ground select line GSL, a plurality of string select lines SSL1 to SSL3, and a common source line CSL. In this regard, the number of NAND strings, the number of word lines, the number of bit lines, the number of ground select lines, and the number of string select lines may be variously changed according to an example embodiment.

The NAND strings NS11 to NS33 may be provided between the first bit line BL1 and the common source line CSL. The NAND strings NS13, NS23, NS33 may be provided between the third bit line BL3 and the common source line CSL. Each NAND string (for example, NS11) may include a string select transistor SST, a plurality of memory cells MC1 to MC8, and a ground select transistor GST which are connected in series. Hereinafter, the NAND string will be referred to as a string for convenience.

Strings connected to one bit line in common may constitute one column. For example, the strings NS11, NS21, NS31 connected to the first bit line BL1 in common may correspond to a first column, the strings NS12, NS22, NS32 connected to the second bit line BL2 in common may correspond to a second column, and the strings NS13, NS23, NS33 connected to the third bit line BL3 in common may correspond to a third column.

Strings connected to one string select line may constitute one row. For example, the strings NS11, NS12, NS13 connected to the first string select line SSL1 may correspond to a first row, the strings NS21, NS22, NS23 connected to the second string select line SSL2 may correspond to a second row, and the strings NS31, NS32, NS33 connected to the third string select line SSL3 may correspond to a third row.

The string select transistors SST may be respectively connected to the string select line SSL1 to SSL3. The plurality of memory cells MC1 to MC8 may be respectively connected to the corresponding word lines WL1 to WL8. The ground select transistor GST may be connected to the ground select line GSL. The string select transistor SST may be connected to the corresponding bit line BL. The ground select transistor GST may be connected to the common source line CSL.

The word line of the same height (for example, WL1) may be connected in common. The string select lines SSL1 to SSL3 may be separated from each other. When memory cells connected to the first word line WL1 and belonging to the NAND strings NS11, NS12, NS13 are programmed, the first word line WL1 and the first string select line SSL1 may be selected.

Figure 7:
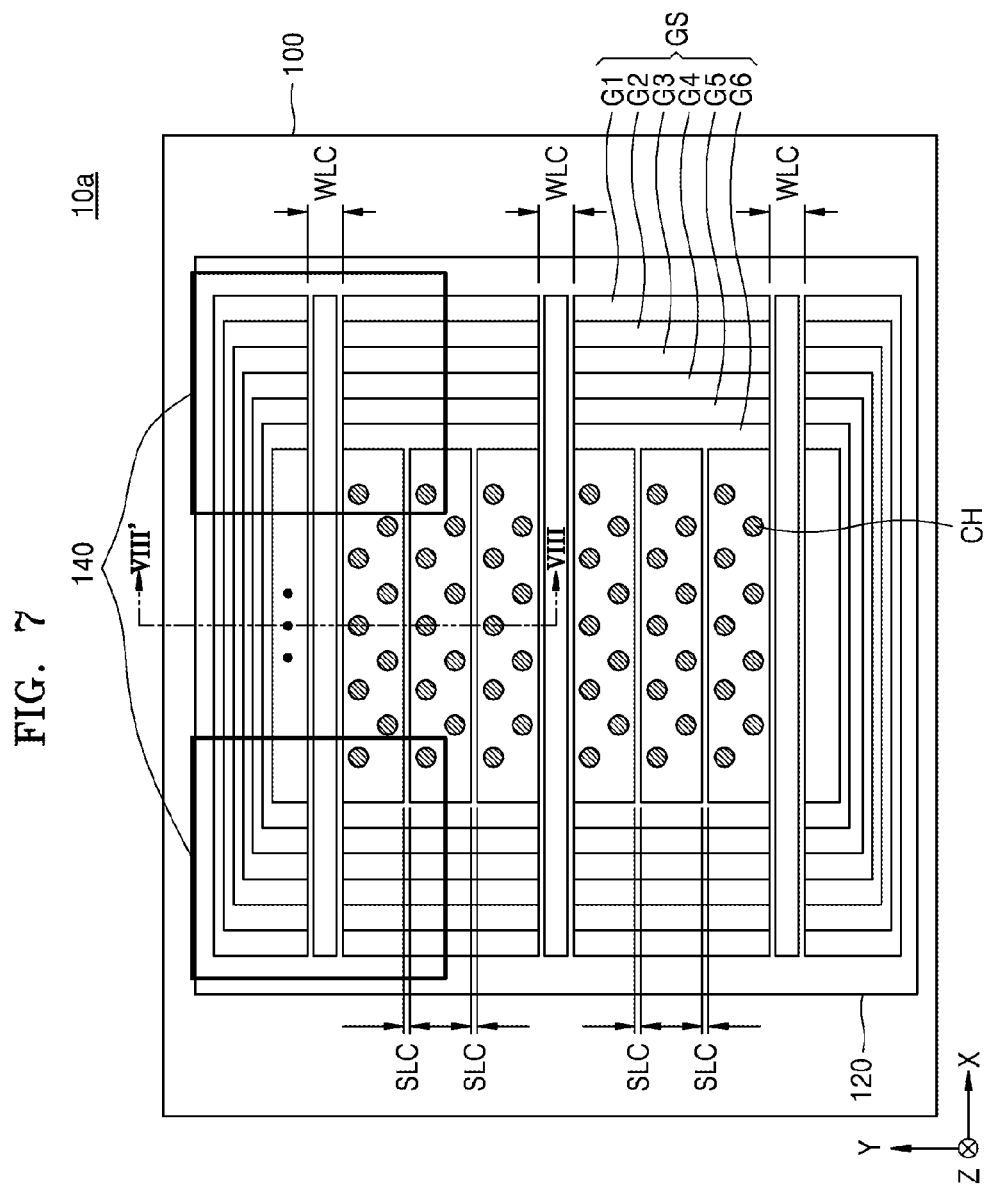
FIG. 7 is a layout diagram of a memory device according to some example embodiments.
Figure 8:
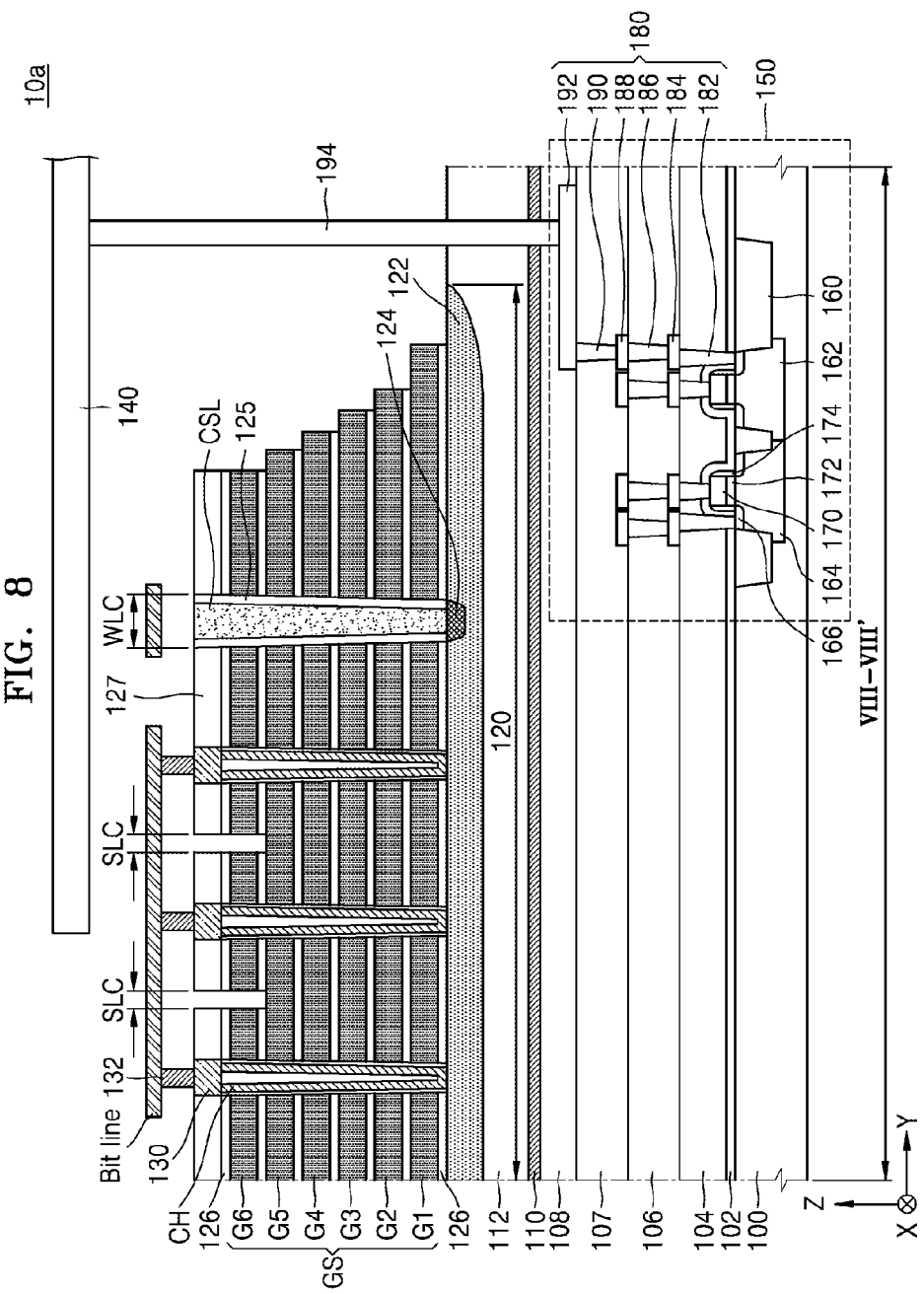
FIG. 8 is a cross-sectional view of the memory device of FIG. 7.

FIG. 7 is a layout diagram of a memory device 10a according to an example embodiment. FIG. 8 is a cross-sectional view taken from a line VIII-VIII' of FIG. 7.

A layout of the memory device 10a is similar to a layout of the memory device 10 of FIG. 1. However, the bonding pads 140 of FIG. 1 may vertically overlap with one of edge regions of the memory cell array 120, whereas bonding pads 140 of FIG. 7 may vertically overlap with a part of a region of a memory cell array 120 having the channels CH. In this regard, the region having the channels CH that overlaps with the bonding pads 140 may be implemented as dummy channel holes.

Figure 9:
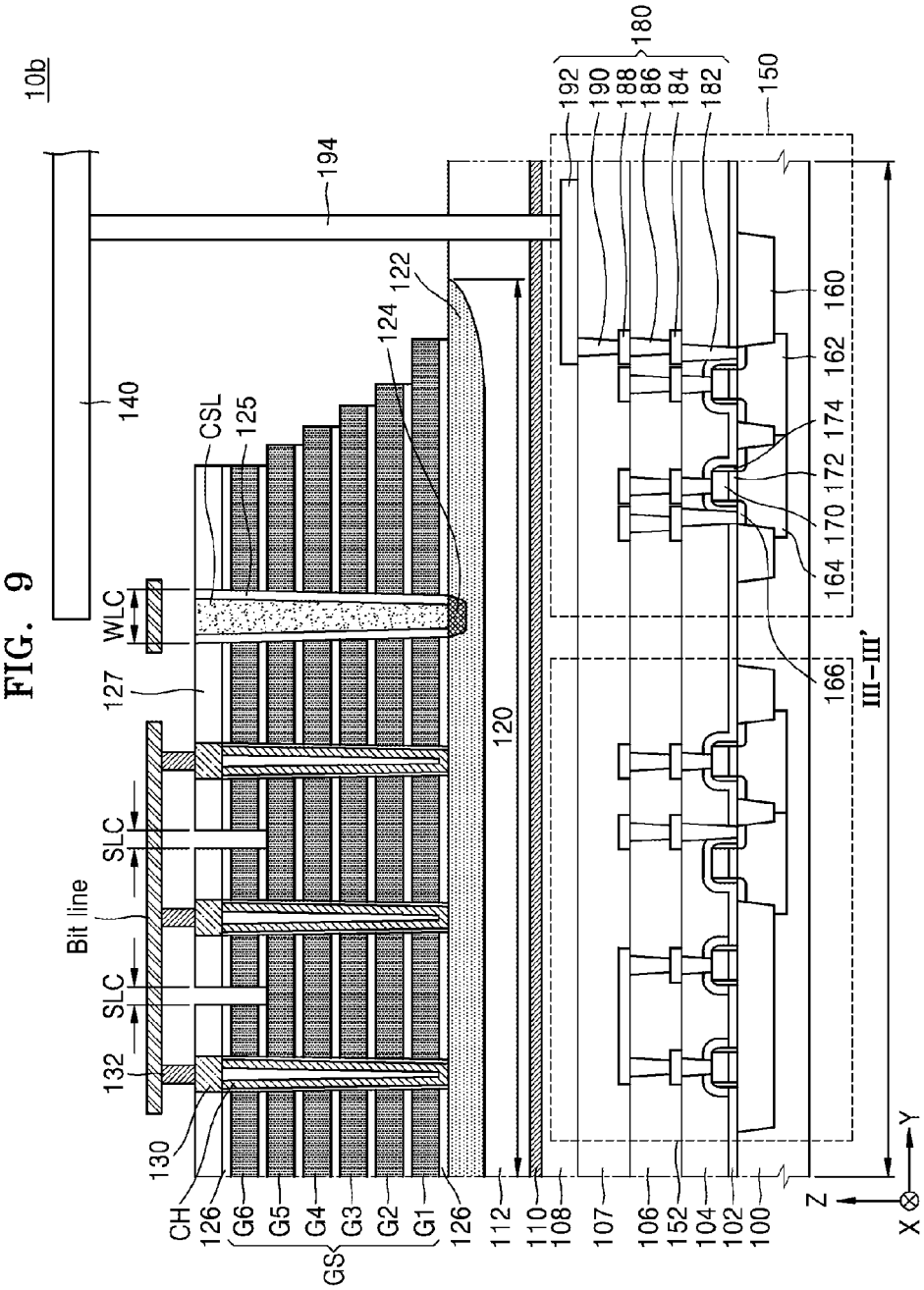
FIG. 9 is a cross-sectional view of a memory device according to an example embodiment.

FIG. 9 is a cross-sectional view of a memory device 10b taken from a line III-III' of FIG. 1 according to an example embodiment. A layout of the memory device 10b is the same as a layout of the memory device 10 of FIG. 1. Thus, descriptions provided with reference to FIG. 1 may apply to FIG. 9.

In FIG. 9, a memory cell array 120 may be formed on a peripheral circuit 152 in the memory device 10b. Such a circuit structure of the memory device 10b may be referred to as a COP circuit structure.

Referring to FIG. 9, the memory device 10b may include the peripheral circuit 152 formed on a substrate 100 and the memory cell array 120 formed on an upper portion of the substrate 100. The peripheral circuit 152 may be disposed adjacent to a pad circuit 150 on the substrate 100 in a horizontal direction.

The peripheral circuit 152 may include a page buffer, a latch circuit, a cache circuit, a column decoder, a row decoder, or a sense amplifier, etc.

The memory cell array 120 disposed on the substrate 100 may have a circuit configuration as shown in FIGS. 5 and 6.

FIGS. 10 through 18 are cross-sectional views for sequentially describing a method of manufacturing the memory device 10 according to an example embodiment. An example of the method of manufacturing the memory device 10 shown in FIGS. 1 through 3 will be described.

Figure 10:
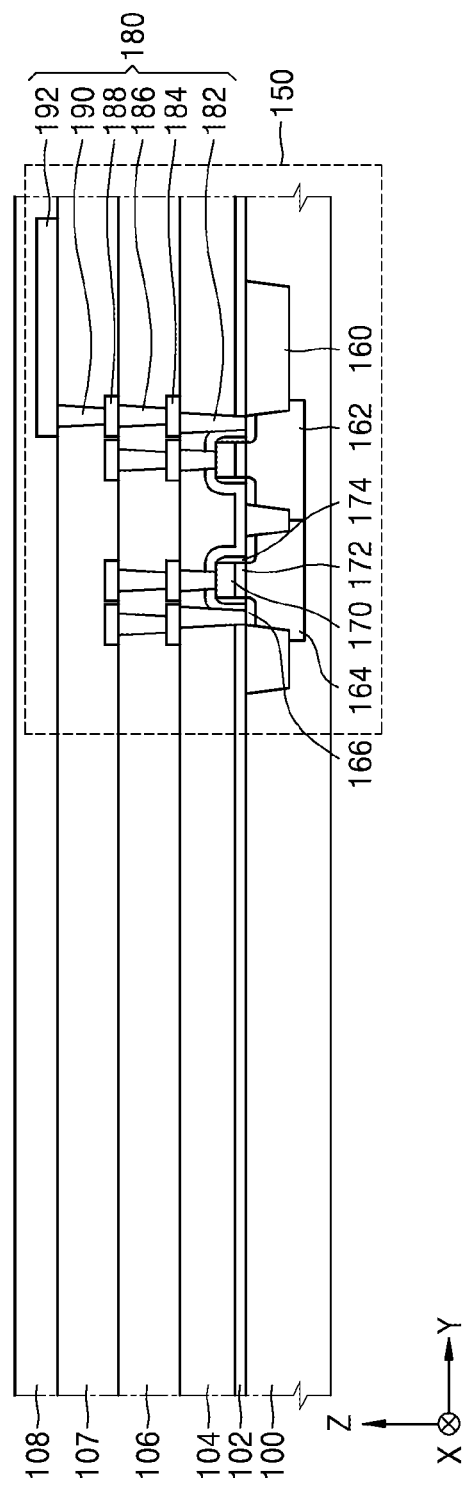
FIGS. 10 through 18 are cross-sectional views for sequentially describing a method of manufacturing a memory device according to some example embodiments.

Referring to FIG. 10, the pad circuit 150 may be formed on a partial region of the substrate 100.

In more detail, an active region may be formed by forming a trench in the substrate 100 and burying the trench with an insulating material such as a silicon oxide, etc. Thereafter, the P type well 162 for the pad circuit 150 and the N type well 164 for the pad circuit 150 may be formed in the substrate 100 through a plurality of ion injection processes. The P type well 162 for the pad circuit 150 may be a region for forming an NMOS transistor. The N type well 164 for the pad circuit 150 may be a region for forming a PMOS transistor.

The gate insulating layer 172 for the pad circuit 150 may be formed on the substrate 100. Thereafter, the gate 170 for the pad circuit 150 may be formed on the gate insulating layer 172. The gate 170 may include doped polysilicon, metal, or a combination of these. The insulating spacer 174 may be formed in side walls of the gate 170. The source/drain region 166 may be formed in both sides of the gate 170 of the substrate 100. The source/drain region 166 for forming the NMOS transistor may be formed by injecting n type impurities into the substrate 100. The source/drain region 166 for forming the PMOS transistor may be formed by injecting p type impurities into the substrate 100. The source/drain region 166 may have a lightly doped drain (LDD) structure. Accordingly, a plurality of transistors including the gate insulating layer 172, the gate 170, and the source/drain region 166 may be formed.

The etching stop layer 102 may be formed on the plurality of transistors and the insulating spacer 174. The etching stop layer 102 may include an insulating material including, for example, a silicon nitride, a silicon oxynitride, or a combination thereof.

The multilayer wiring structure 180 including the first contact 182, the first wiring layer 184, the second contact 186, the second wiring layer 188, the third contact 190, and the third wiring layer 192 and the plurality of interlayer insulating layers 104, 106, 107, and 108 that may insulate the multilayer wiring structure 180 may be formed on the etching stop layer 102. The third wiring layer 192 of the multilayer wiring structure 180 may be an uppermost wiring layer.

Figure 11:
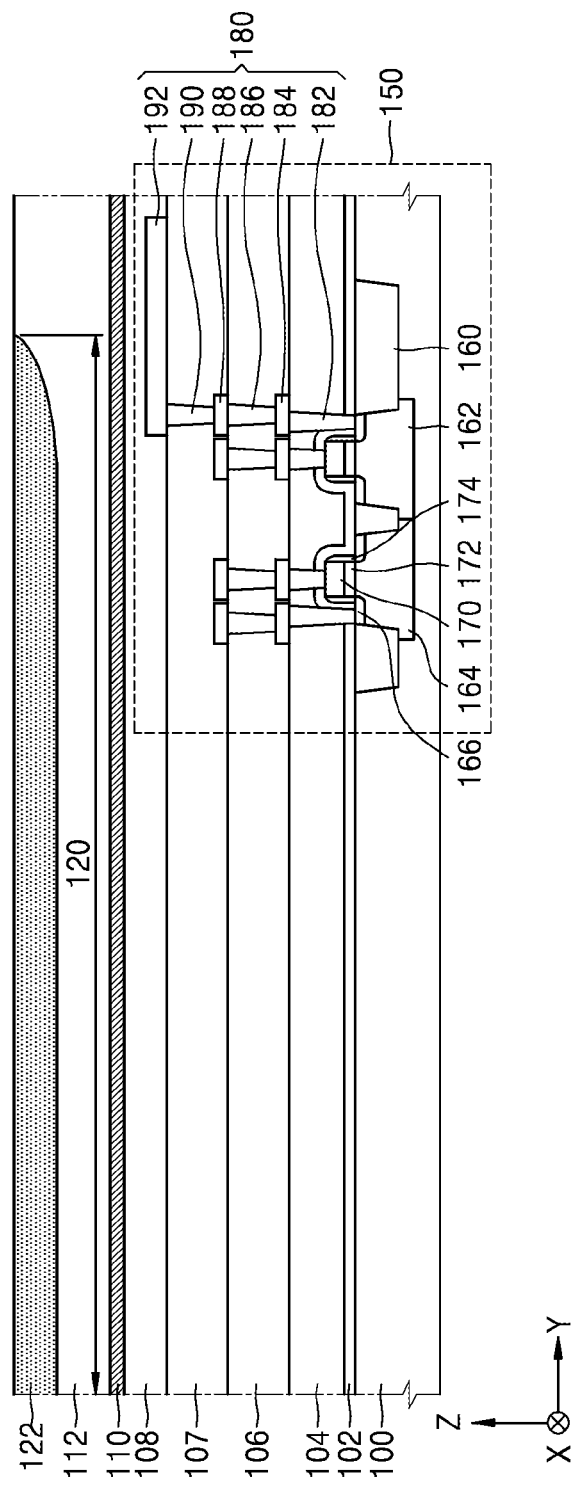

Referring to FIG. 11, the insulating thin film 110 may be formed on the interlayer insulating layer 108 covering the third wiring layer 192 that is the uppermost wiring layer of the multilayer wiring structure 180. In other example embodiments, the insulating thin film 110 may be a barrier metal layer and may include titanium, tantalum, a titanium nitride, etc.

The first semiconductor layer 112 may be formed on the insulating thin film 110. The first semiconductor layer 112 may be formed by using polysilicon doped with first impurities through a chemical vapor deposition process, an atomic layer deposition process, a physical vapor deposition process, etc. During a process of forming the first semiconductor layer 112, the first impurities may be in-situ doped or, after the first semiconductor layer 112 is formed, may be doped through an ion injection process. The first impurities may be p type impurities.

A well region 122 may be formed in the first semiconductor layer 112. A first ion injection mask (not shown) may be used to dope the first semiconductor layer 112 with impurities, and thus the well region 122 may be formed in the first semiconductor layer 112. The impurities may be n type impurities or p type impurities.

Figure 12:
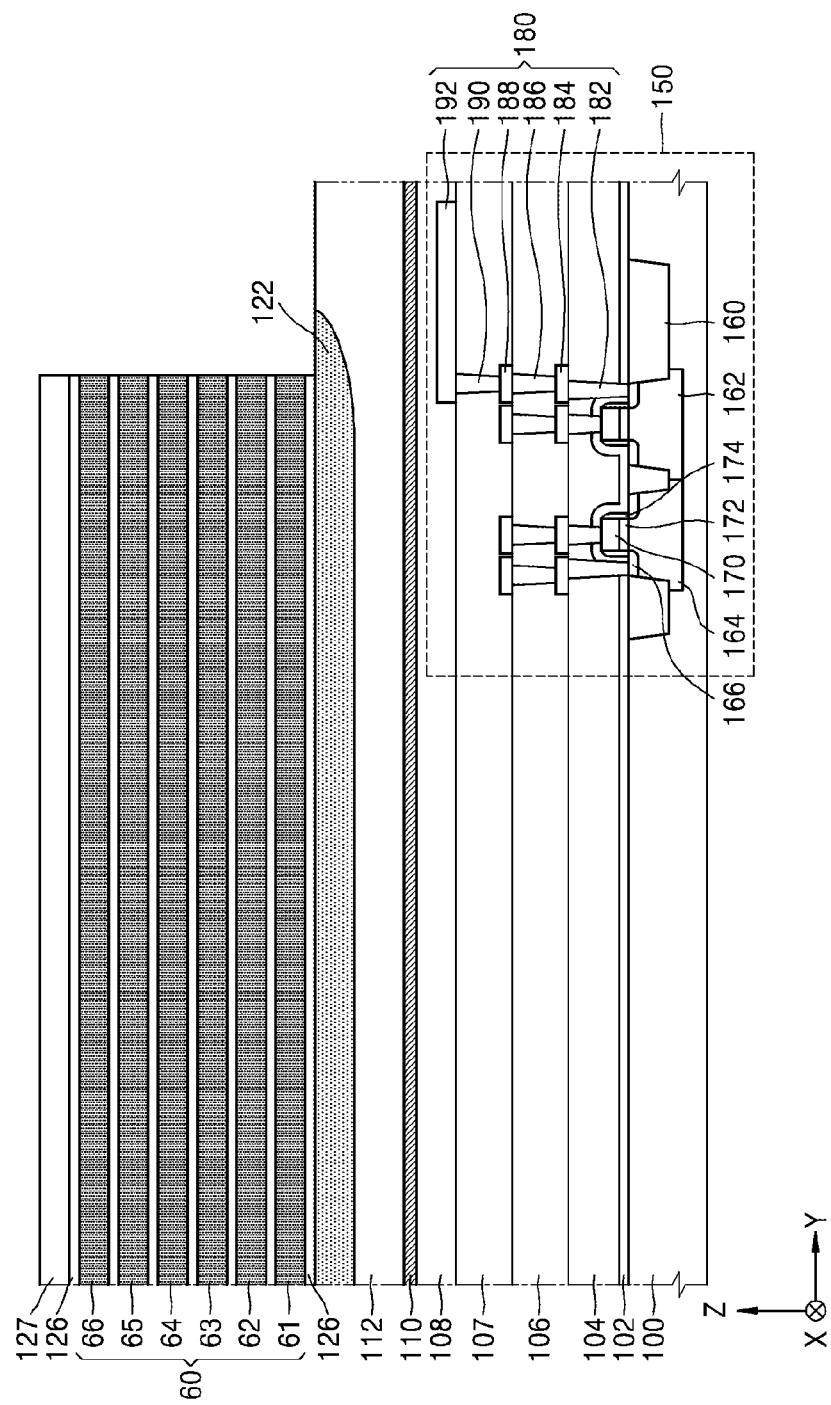

Referring to FIG. 12, a preparatory gate stack structure 60 in which the insulating layer 126 and first through sixth preparatory gate layers 61~66 are alternately stacked may be formed on the first semiconductor layer 112. For example, the insulating layer 126 may be formed of a silicon oxide, a silicon nitride, and a silicon oxynitride, and the height of the insulating layer 126 be based on the same. The preparatory gate layers 61~66 may have a desired (and/or alternatively predetermined) height by using a silicon nitride, a silicon carbide, and polysilicon. A length of the well region 122 may be greater than lengths of the insulating layer 126 and the first through sixth preparatory gate layers 61~66. Accordingly, the length of the well region 122 and the first through sixth preparatory gate layers 61~66 may be disposed inside the well region 122.

The first through sixth preparatory gate layers 61~66 may be preparatory layers or sacrificial layers for forming a ground select line, a plurality of word lines, and a string select line. The number of the first through sixth preparatory gate layers 61~66 may be properly selected according to the number of the ground select line, the word lines, and the string select line.

Figure 13:
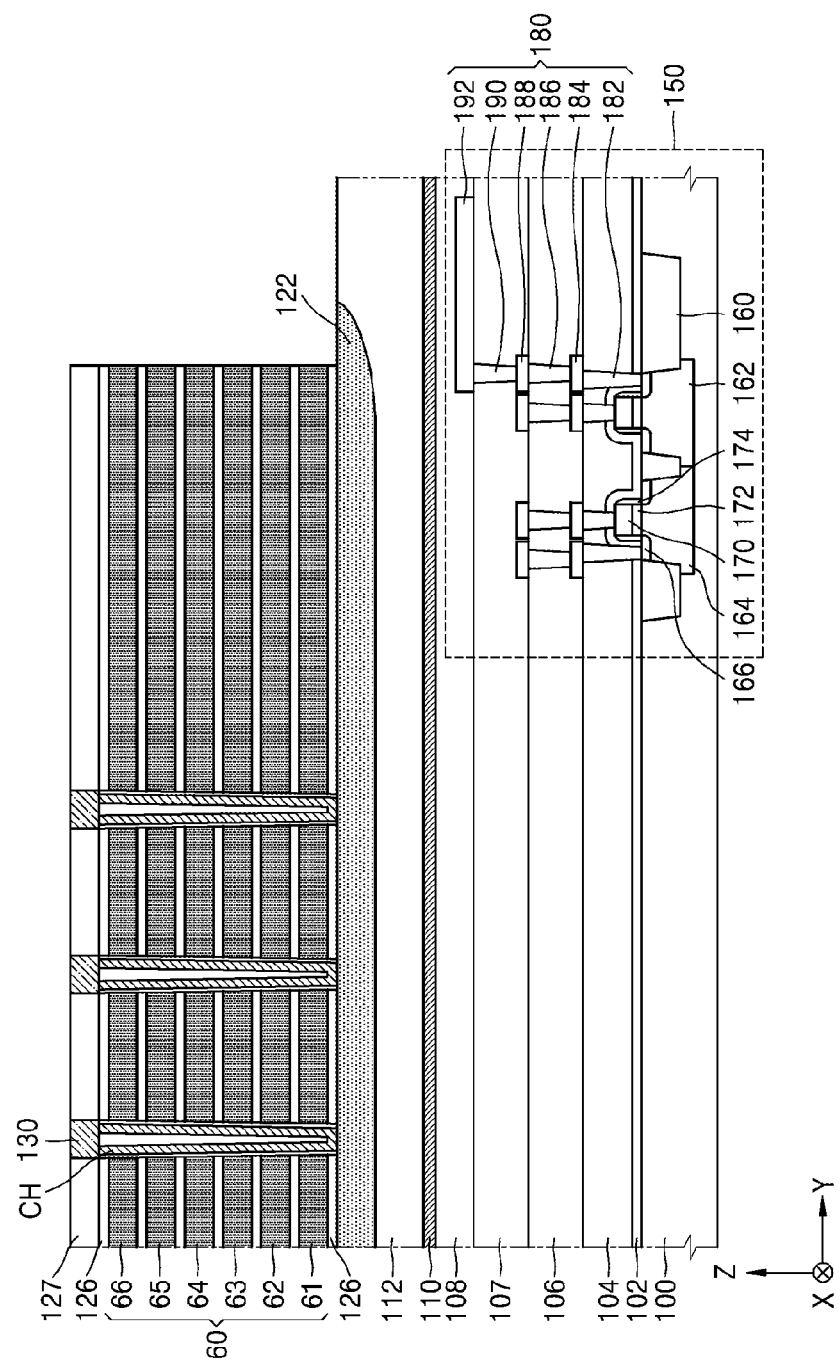

Referring to FIG. 13, the channels CH may be formed in the well region 122 by penetrating into the preparatory gate stack structure 60 and may extend in a third direction perpendicular to a main surface of the substrate 100. The channels CH may be spaced apart from each other in first and second directions. An upper surface of the well region 122 may be exposed by bottom portions of the channels CH.

Although a part of the well region 122 exposed by the bottom portions of the channels CH has a flat shape, the part of the well region 122 exposed by the bottom portions of the channels CH may be over-etched so that a recess (not shown) may be formed in an upper surface of the well region 122. The channels CH may include a gate insulating layer, a channel layer, and a burial insulating layer.

Figure 14:
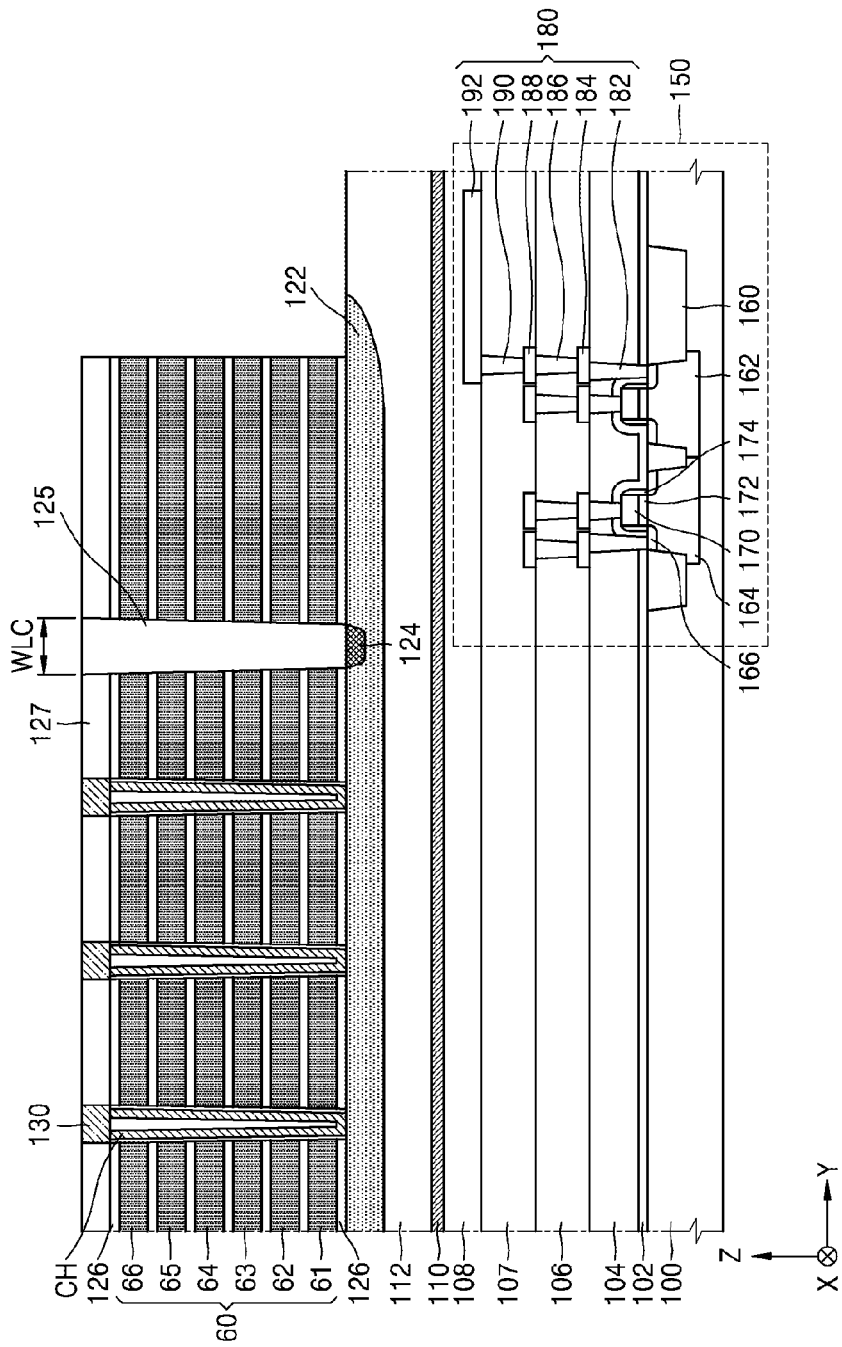

Referring to FIG. 14, the word line cut WLC may be formed by penetrating into the plurality of insulating layers 126 and the plurality of preparatory gate stack structures 60 and may expose the well region 122. The common source region 124 may be formed by injecting impurity ions into the well region 122 through the word line cut WLC. The first through sixth preparatory gate layers 61~66 may be substituted with the plurality of gate conductive layers GS, for example, a ground select line, a plurality of word lines, and a string select line. In this regard, the first through sixth preparatory gate layers 61~66 may be disposed inside the well region 122 and may overlap with the well region 122 in a vertical direction.

In some example embodiments in which the first through sixth preparatory gate layers 61~66 are substituted with the ground select line, the plurality of word lines, and the string select line, when the first through sixth preparatory gate layers 61~66 include polysilicon, a siliciding process may be performed on the first through sixth preparatory gate layers 61~66. In this case, the ground select line, the plurality of word lines, and the string select line may respectively include tungsten silicide, tantalum silicide, cobalt silicide, or nickel silicide but are not limited thereto. In some other embodiments, the ground select line, the plurality of word lines, and the string select line may be formed by selectively removing the first through sixth preparatory gate layers 61~66 exposed through the word line cut WLC and burying a conductive material in empty spaces between the plurality of insulating layers 126. In this case, the ground select line, the plurality of word lines, and the string select line may include a metal material such as tungsten, tantalum, cobalt, nickel, etc.

Figure 15:
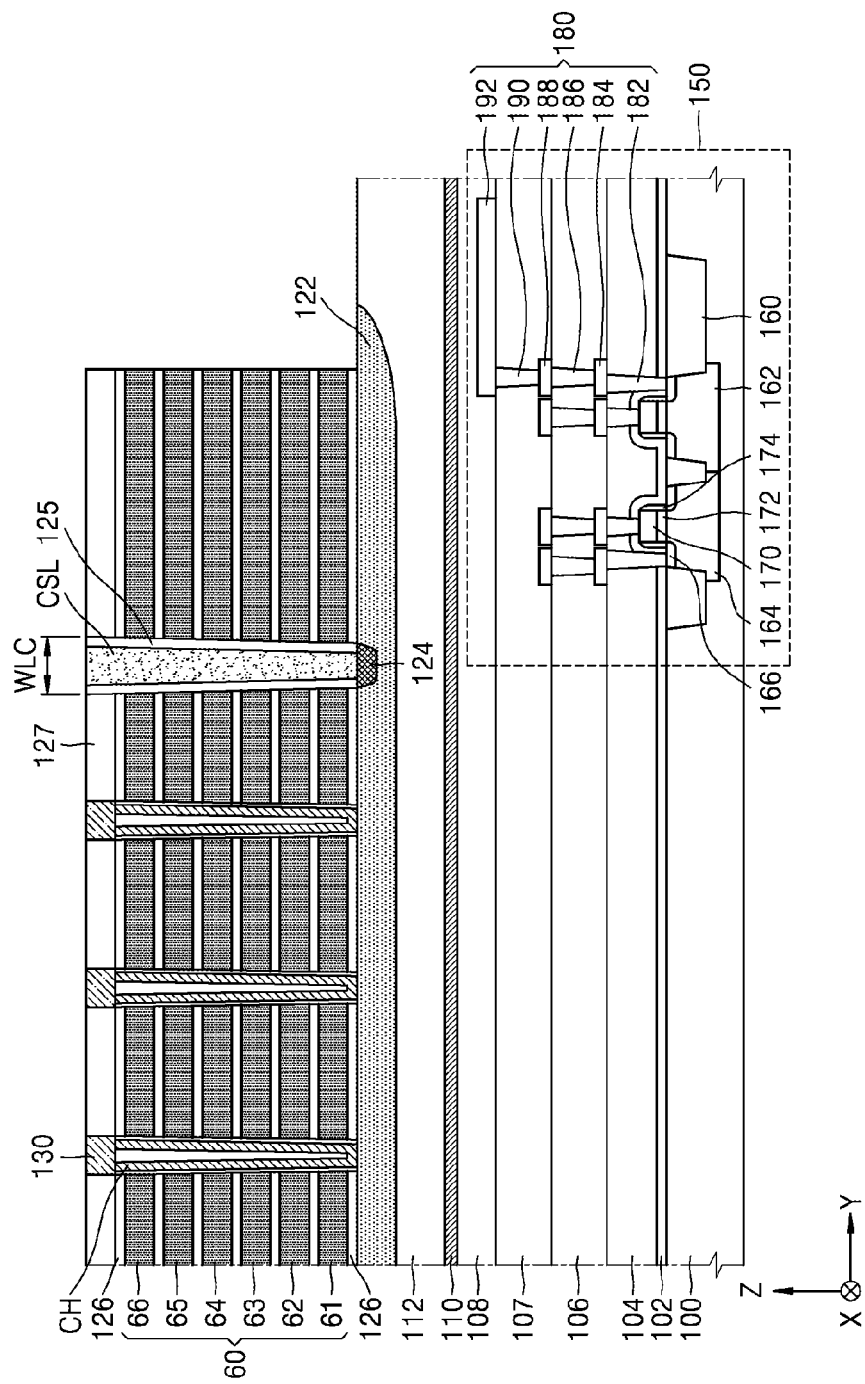

Referring to FIG. 15, the common source line spacer 125 and the common source line CSL may be formed in each of the plurality of word line cuts WLC.

The common source line spacer 125 may include a silicon oxide, a silicon nitride, or a silicon oxynitride. The common source line CSL may include a conductive material. For example, the common source line CSL may include at least one metal material selected from tungsten (W), aluminum (Al), and copper (Cu). In some example embodiments, a metal silicide layer (not shown) for reducing contact resistance may be disposed between the common source region 124 and the common source line CSL. For example, the metal silicide layer may include cobalt silicide.

Figure 16:
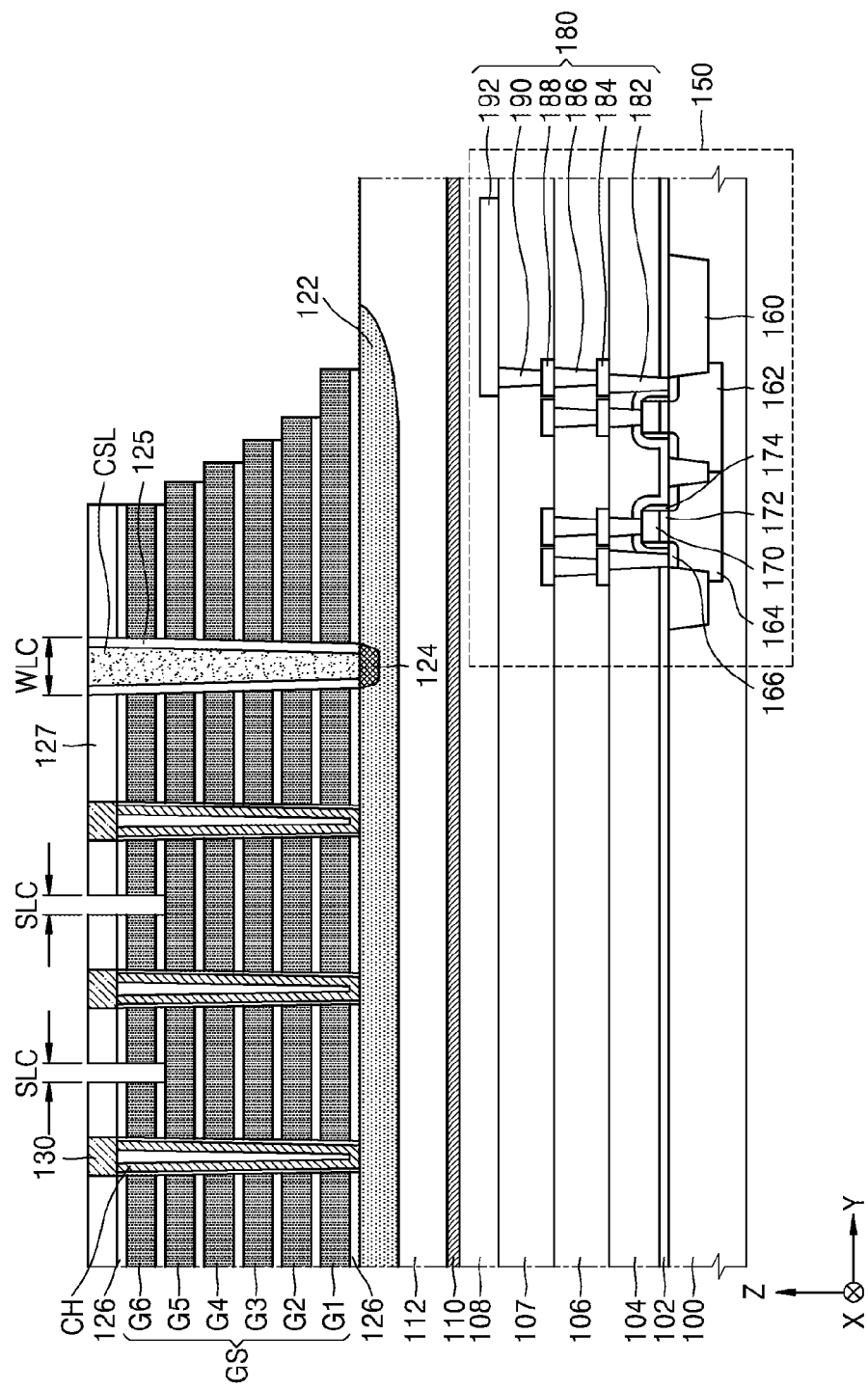

Referring to FIG. 16, an insulating layer (not shown) covering the common source line CSL and a plurality of drain regions 130 may be formed and then filled in a string select line cut region SLC formed by removing a partial region of the insulating layer 126 and the first through sixth preparatory gate layers 61~66. After removing a partial region of the first through sixth preparatory gate layers 61~66, the gate conductive layers GS are formed from the first through sixth preparatory gate layers 61~66.

Thereafter, a mask (not shown) may be used to pattern the ground select line, the plurality of word lines, and the string select line through a plurality of patterning processes. The insulating layers 126 may be patterned in alignment with gate conductive layers GS adjacent to the insulating layers 126. Thereafter, an insulating layer (not shown) covering the etching stop layer 127 and sides of the patterned gate conductive layers GS may be formed.

The patterned gate conductive layers GS may be disposed inside the well region 122. Alternatively, at least some of the patterned gate conductive layers GS may be disposed outside the well region 122.

Figure 17:
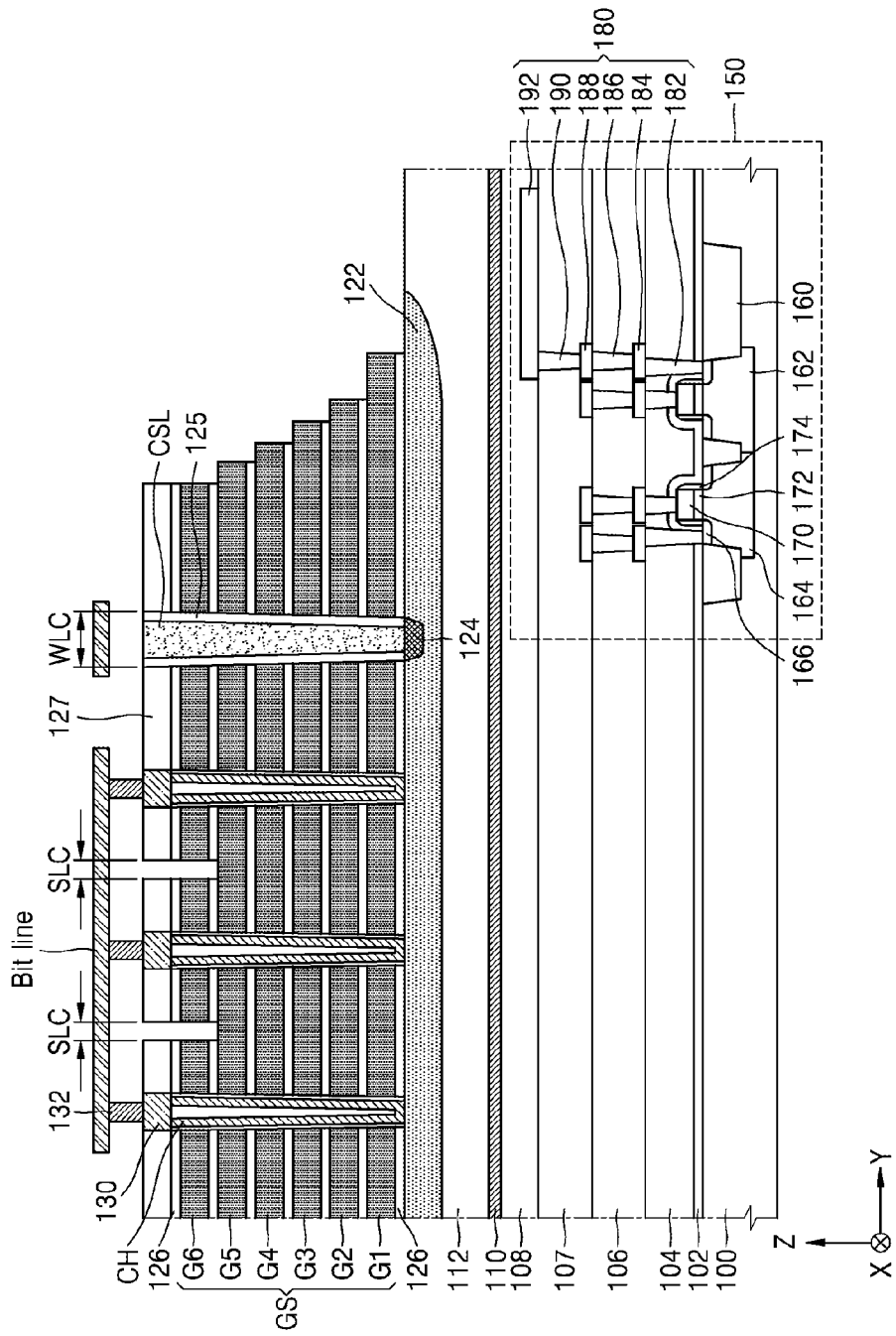

Referring to FIG. 17, a plurality of bit line contacts 132 may be formed by forming a plurality of bit line contact holes (not shown) that expose the plurality of drain regions 130 by removing a partial region of an insulating layer covering the plurality of drain regions 130 and burying a conductive material in the plurality of bit line contact holes. Thereafter, bit lines connected to the bit line contacts 132 may be formed.

Figure 18:
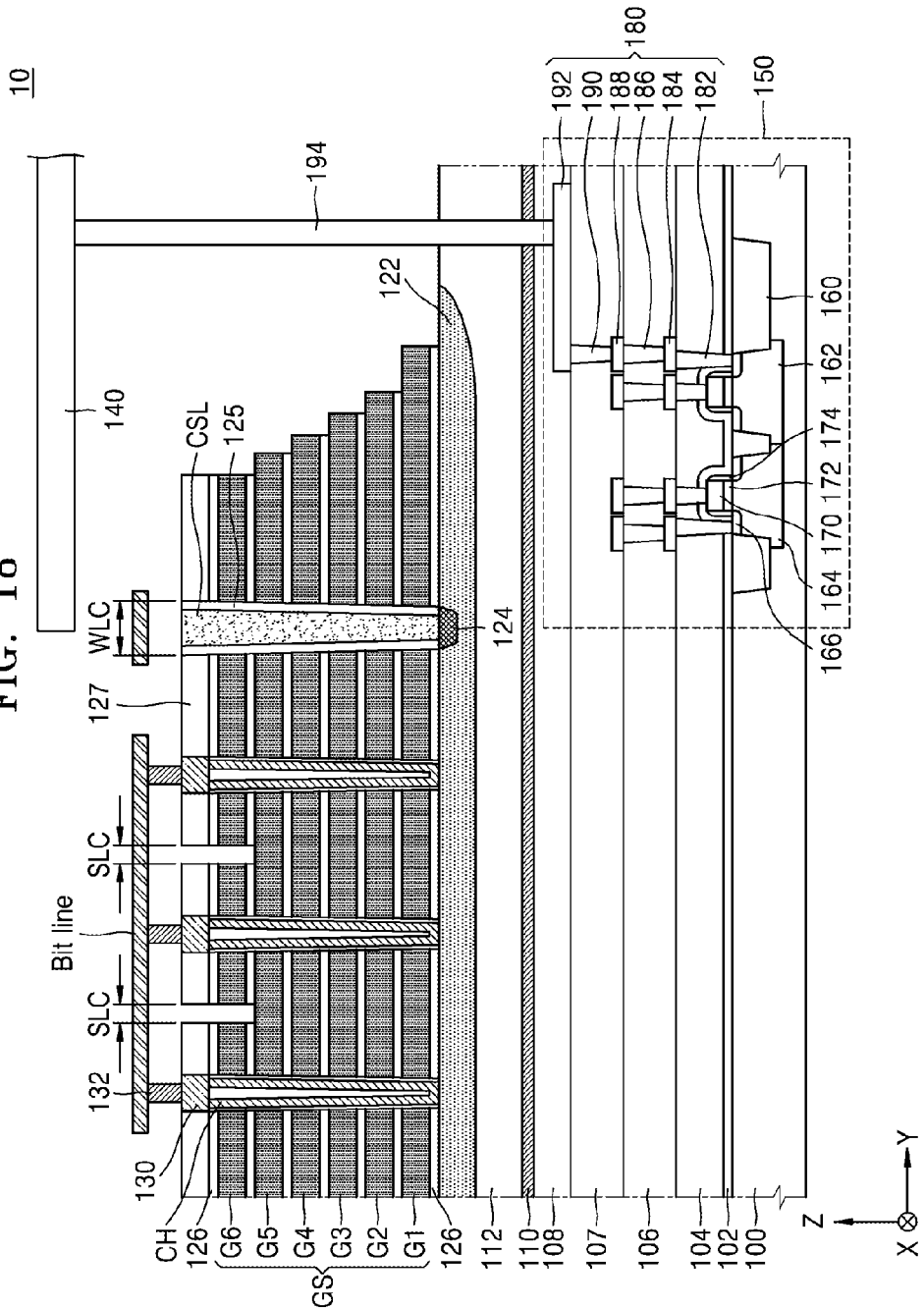

Referring to FIG. 18, the plurality of bonding pad contacts 194 may be formed by forming a plurality of bonding pad contact holes (not shown) that expose the third wiring layer 192 by removing a partial region of the first semiconductor layer 112, the insulating thin film 110, and the fourth interlayer insulating layer 108 that cover the third wiring layer 192 and burying a conductive material in the bonding pad contact holes. Thereafter, the bonding pads 140 connected to the bonding pad contacts 194 may be formed.

Examples of a metal material used as the bonding pad contacts 194 may include W, Au, Ag, Cu, Al, TiAlN, WN, Jr, Pt, PD, Ru, Zr, Rh, Ni, Co, Cr, Sn, Zn, etc. The bonding pad contacts 194 may include the metal material having rigidity suitable for a chemical and mechanical polishing process. For example, the bonding pad contacts 194 may include tungsten. The bonding pad contacts 194 may further include a barrier metal layer. The bonding pad contacts 194 may have a flat upper surface.

The bonding pads 140 may include a material different from metal included in the bonding pad contacts 194. The bonding pads 140 may include a material having lower resistance than that of the metal included in the bonding pad contacts 194. For example, when the bonding pad contacts 194 include tungsten, the bonding pads 140 may include aluminum or an aluminum alloy.

Figure 19:
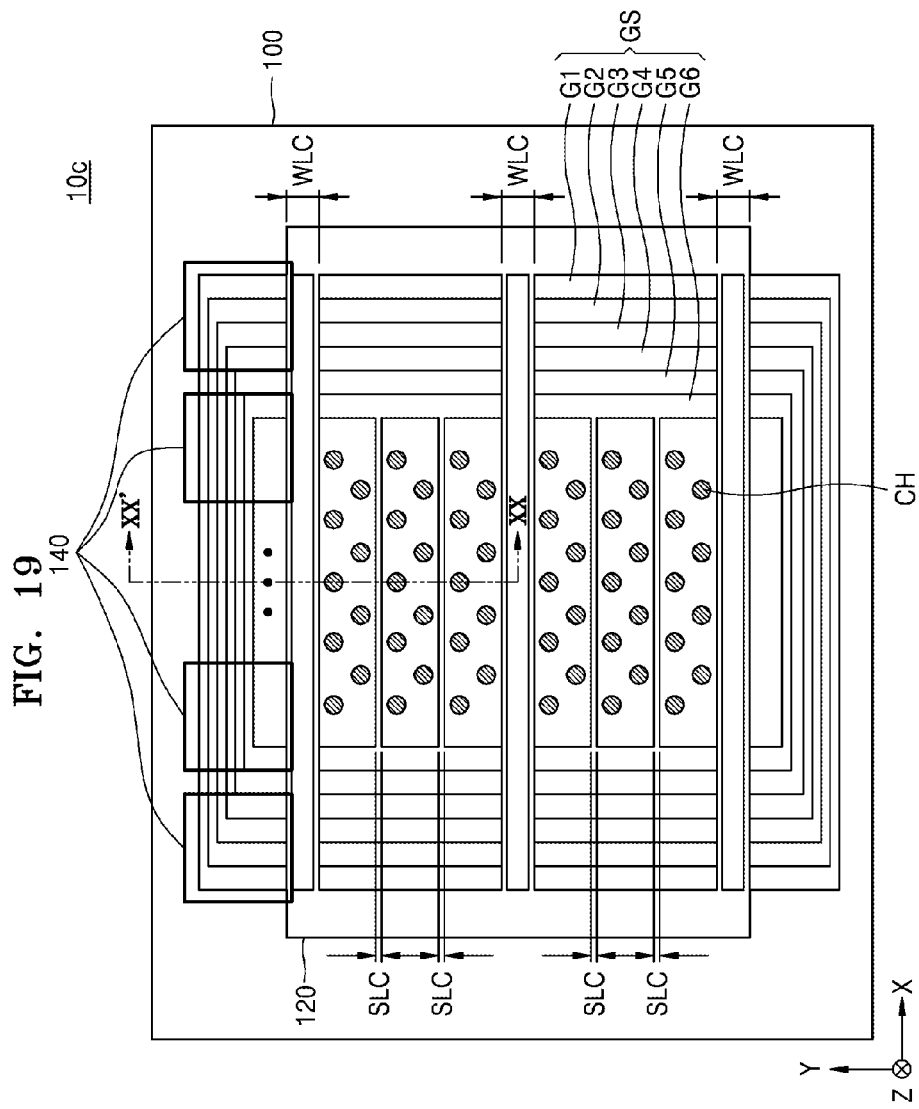
FIG. 19 is a layout diagram of a memory device according to an example embodiment.
Figure 20:
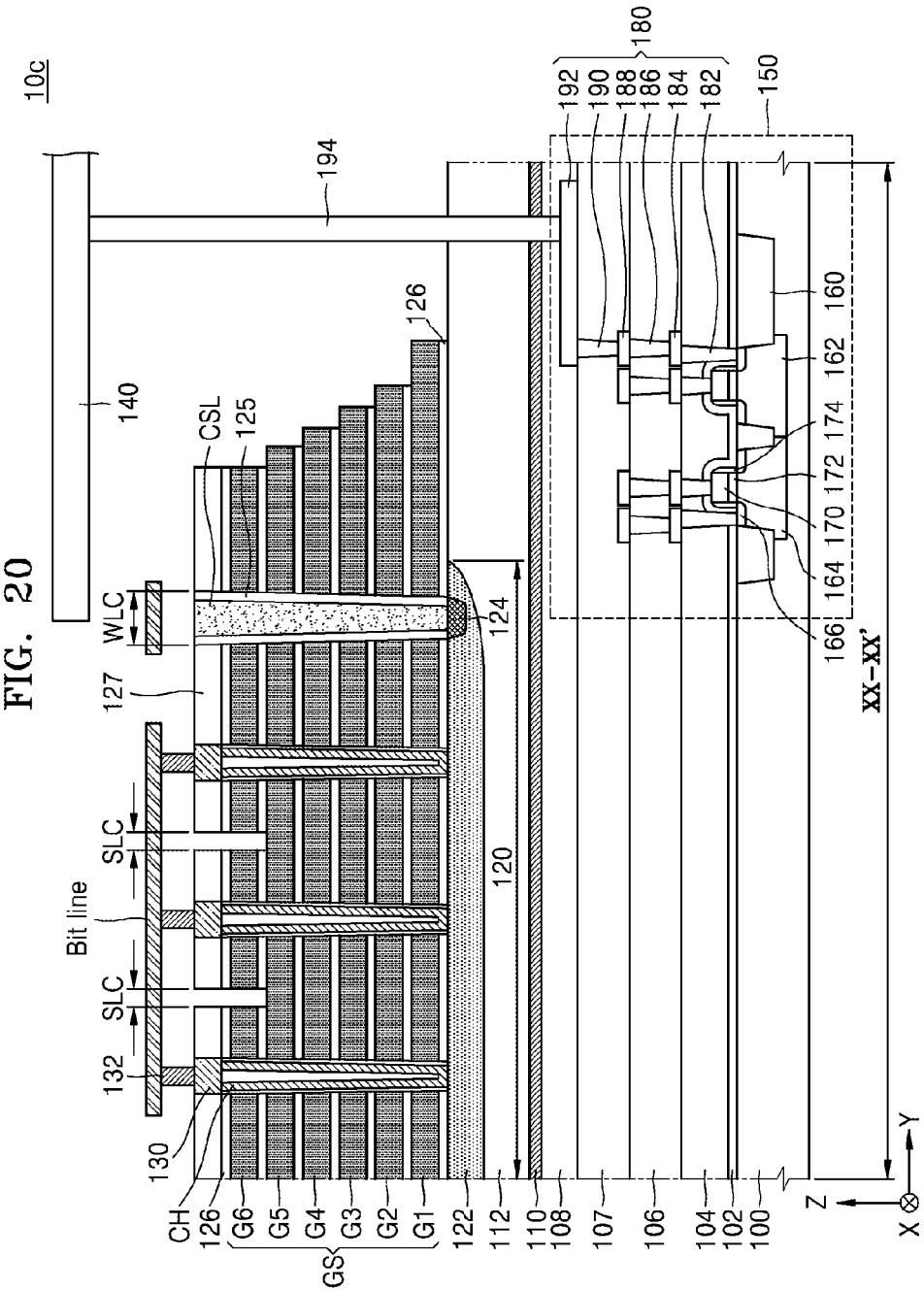
FIG. 20 is a cross-sectional view of the memory device of FIG. 19.

FIG. 19 is a layout diagram of a memory device 10c according to an example embodiment. FIG. 20 is a cross-sectional view taken from a line XX-XX' of FIG. 19.

A layout of the memory device 10c of FIG. 19 is similar to a layout of the memory device 10 of FIG. 1. However, the memory cell array 120 of FIG. 1 includes all the gate conductive layers GS formed on the substrate 100, whereas a memory cell array 120 of FIG. 19 includes the gate conductive layers GS excluding an edge region of at least one of the gate conductive layers GS separated by the word line cut WLC.

No electrical signal may be applied to the edge region of at least one of the gate conductive layers GS separated by the word line cut WLC. Bonding pads 140 may be formed on an upper portion of a part of at least one of the gate conductive layers GS separated by the word line cut WLC.

Figure 21:
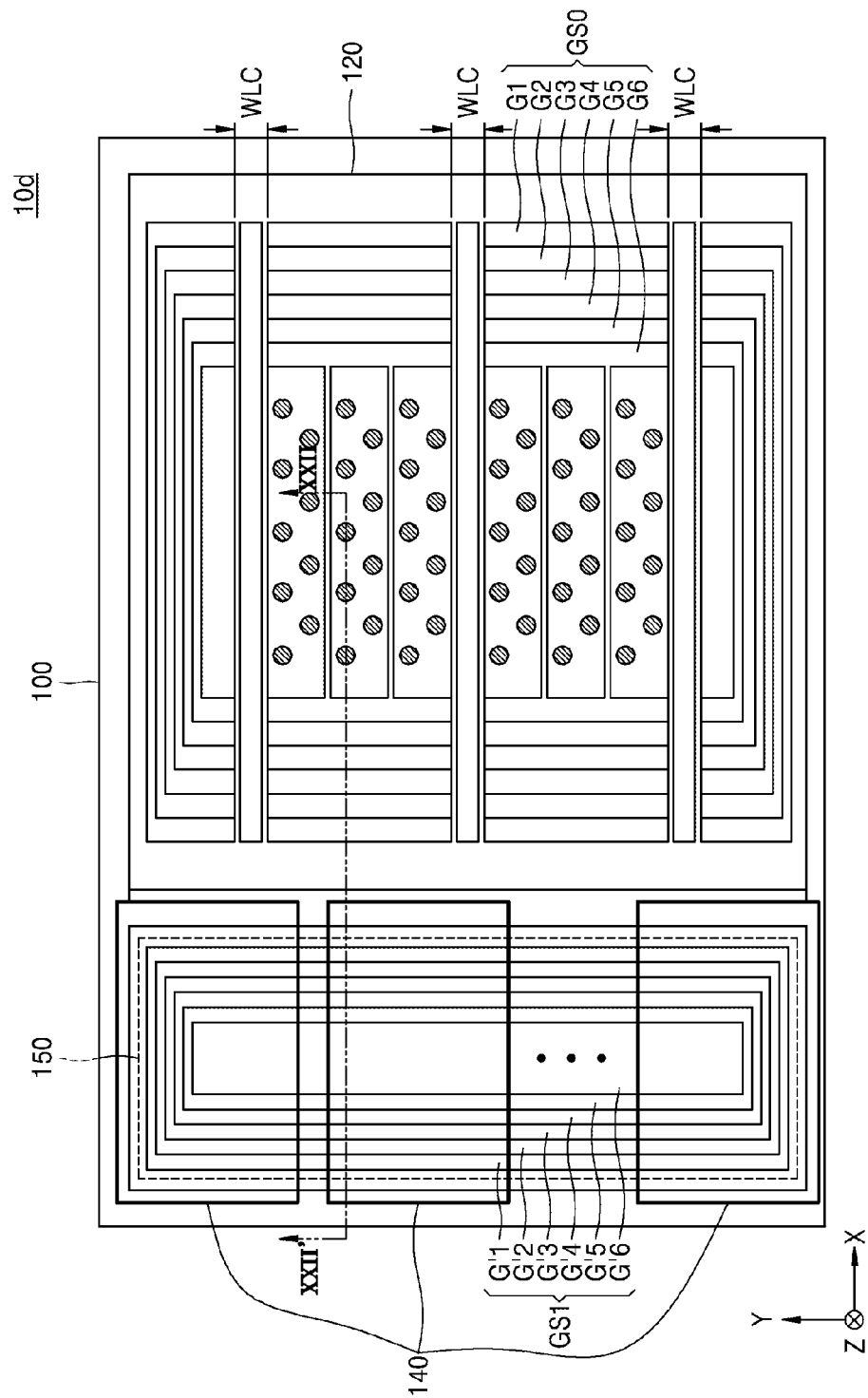
FIG. 21 is a layout diagram of a memory device according to an example embodiment.
Figure 22:
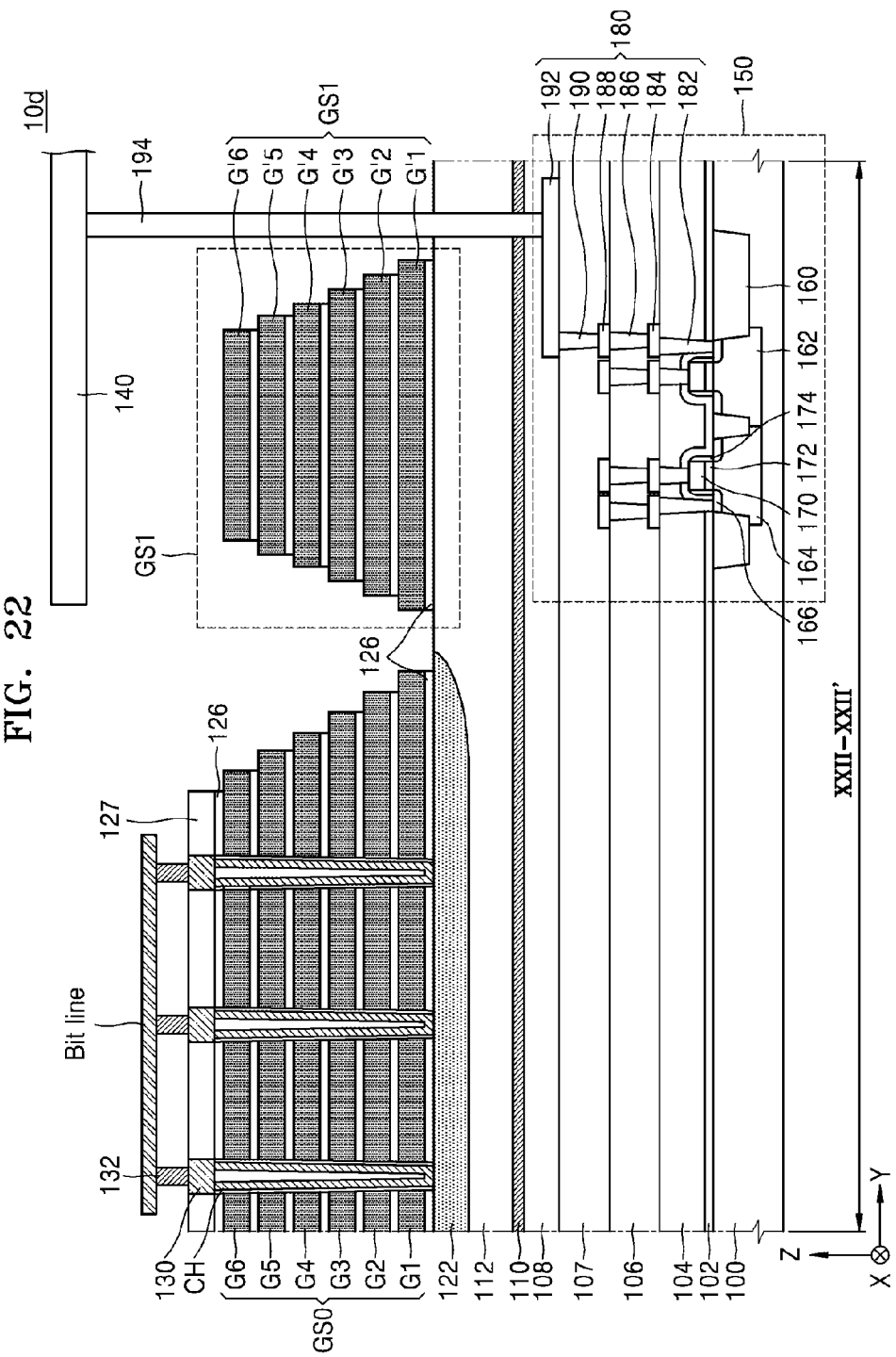
FIG. 22 is a cross-sectional view of the memory device of FIG. 21.

FIG. 21 is a layout diagram of a memory device 10d according to an example embodiment. FIG. 22 is a cross-sectional view taken from a line XXII-XXII' of FIG. 21.

In a layout of the memory device 10d of FIG. 21, first gate conductive layers GS0 and second gate conductive layers GS1 may be formed on an upper portion of a substrate 100, unlike layouts of the example embodiments described above.

The first gate conductive layers GS0 may configure a memory cell array 520. The first gate conductive layers GS0 may include the plurality of gate electrodes G1~G6 and the plurality of channels CH. The plurality of gate electrodes G1~G6 may be referred to as word lines, string select lines or ground select lines, etc. The plurality of gate electrodes G1~G6 may be stacked in a direction (z direction) perpendicular to the substrate 100.

The plurality of channels CH may penetrate into the plurality of gate electrodes G1~G6 and may be connected to the substrate 100. The plurality of gate electrodes G1~G6 and the plurality of channels CH may configure the 3D memory cell array 120 in FIG. 21.

A second gate structure GS1 may be formed outside the memory cell array 520 and may include a plurality of gate electrodes G1'~G6'. The plurality of gate electrodes G1'~G6' may be stacked in the direction (z direction) perpendicular to the substrate 100.

The second gate structure GS1 may configure a semiconductor element. In an example embodiment, the second gate structure GS1 may be the semiconductor element used in an operation of the memory cell array 120. For example, the second gate structure GS1 may include a passive element such as a capacitor or a resistor. For another example, the second gate structure GS1 may include an active element such as a cell array or a transistor. For example, the second gate structure GS1 may be used as a test element for testing an electrical characteristic of the memory cell array 120. Accordingly, a layout area of the memory device 10d may be reduced, and a size of a semiconductor chip on which the memory device 10d is mounted may be reduced.

A gate electrode of the second gate structure GS1 and a gate electrode of the first gate structure GS0, which are located at the same height from a main surface of the substrate 100, may be generated at the same process. For example, the first gate electrode G1 of the first gate structure GS0 and the first gate electrode G'1 of the second gate structure GS1 may be generated at the same process. Accordingly, the gate electrodes located at the same height from the main surface of the substrate 100 may have the same height and material.

In FIGS. 21 and 22, each of the first gate structure GS0 and the second gate structure GS1 includes the first through sixth gate electrodes G1~G6 and G1'~G6', this is for convenience of description and inventive concepts are not limited thereto. The number of gate electrodes may vary depending on a structure of cell strings included in the memory cell array 520.

A pad circuit 150 may be disposed on the substrate 100, more specifically, between the substrate 100 and the memory cell array 120. That is, the memory cell array 120 may be disposed on an upper portion of the pad circuit 150 disposed on the substrate 100. Such a structure may be referred to as a COP structure. The COP structure may effectively reduce an area occupying a surface perpendicular to a stack direction, thereby increasing the number of memory cells integrated into the memory device 10d.

The pad circuit 150 may include an ESD circuit, a pull-up/pull-down driver, a data input/output (I/O) circuit, etc.

The bonding pads 140 may be disposed on an upper portion of the second gate structure GS1. That is, at least some of the bonding pads 140 may vertically overlap with the second gate structure GS1. The bonding pads 140 may be electrically connected to the bonding pads 140 through a plurality of bonding pad contacts 194 that penetrate into some of a first semiconductor layer 112, an insulating thin film 110, and an interlayer insulating layer 108. The bonding pad contacts 194 may include a metal material. Examples of the metal material used as the bonding pad contacts 194 may include W, Au, Ag, Cu, Al, TiAlN, WN, Ir, Pt, PD, Ru, Zr, Rh, Ni, Co, Cr, Sn, Zn, etc. The bonding pad contacts 194 may include the metal material having rigidity suitable for a chemical and mechanical polishing process. For example, the bonding pad contacts 194 may include tungsten. The bonding pad contacts 194 may further include a barrier metal layer. The bonding pad contacts 194 may have a flat upper surface.

The bonding pads 140 may include a material different from metal included in the bonding pad contacts 194. The bonding pads 140 may include a material having lower resistance than that of the metal included in the bonding pad contacts 194. For example, when the bonding pad contacts 194 include tungsten, the bonding pads 140 may include aluminum or an aluminum alloy.

Figure 23:
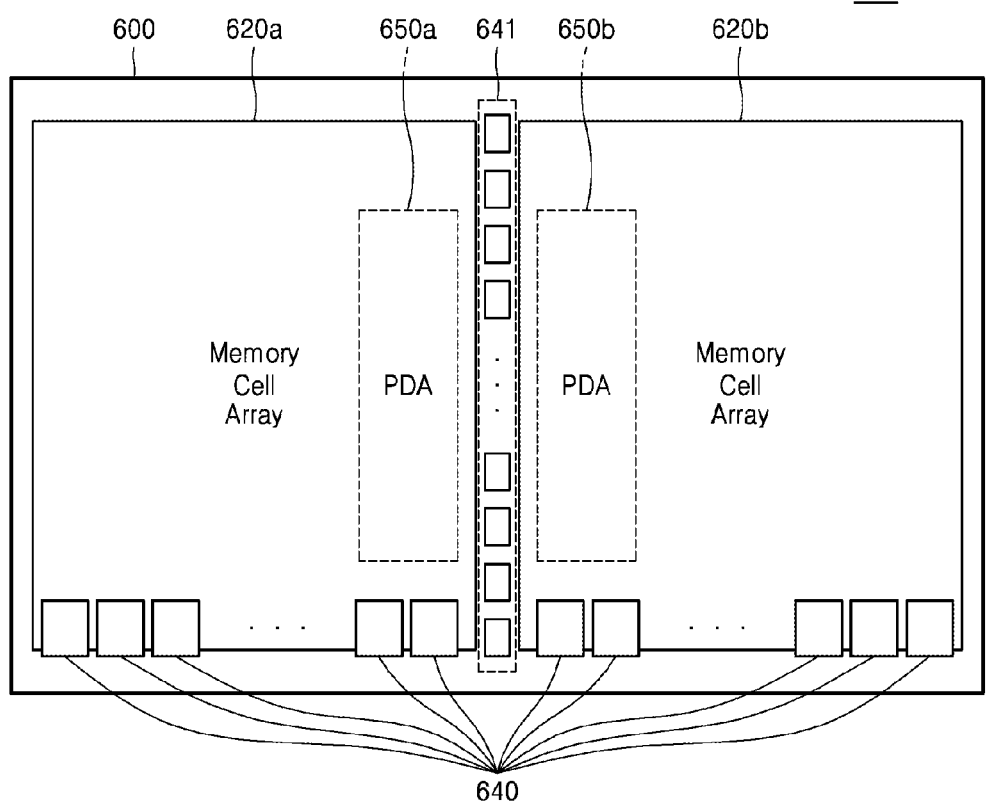
FIG. 23 is a layout diagram of a memory device according to an example embodiment.

FIG. 23 is a layout diagram of a memory device 10e according to an example embodiment. Referring to FIG. 23, the memory device 10e may include a substrate 600, first and second memory cell arrays 620a and 620b, first and second pad circuits 650a and 650b, bonding pads 640, and connection pads 641.

The substrate 600 may have a main surface extending in a first direction (x and y directions). In some example embodiments, the substrate 600 may include Si, Ge, or SiGe. In other example embodiments, the substrate 600 may include a polysilicon substrate, a silicon-on-insulator (SOI) substrate, or a germanium-on-insulator (GeOI) substrate.

In each of the first and second memory cell arrays 620a and 620b, word lines may be independently activated by a plurality of row decoders (not shown), and operations (for example, write and read operations) may be independently controlled through a plurality of page buffers (not shown). A unit of a memory cell array described above which is capable of performing characteristic operations in parallel or performing different operations via independent control by the memory device 10e may be referred to as a plane. The first and second memory cell arrays 620a and 620b illustrated in FIG. 23 may be included in different planes.

The first and second memory cell arrays 620a and 620b may have a vertical stack structure. In more detail, the first and second memory cell arrays 620a and 620b may be configured by forming a plurality of channels (not shown) and gate conductive layers (not shown), etc. on the substrate 600. The first and second memory cell arrays 620a and 620b may have a circuit configuration as shown in FIGS. 5 and 6.

The memory device 10e may be electrically connected to an external device through the plurality of bonding pads 640.

According to an example embodiment, the bonding pads 640 may be disposed on upper portions of at least some of the memory cell arrays 620a and 620b. In other words, at least some of the bonding pads 640 may overlap with the first memory cell array 620a or the second memory cell array 620b in a vertical direction.

Some of the memory cell arrays 620a and 620b overlapping with the bonding pads 640 in the vertical direction may be at least part of an upper portion of edge regions of the memory cell arrays 620a and 620b in which a channel hole (not shown) is not disposed. In an example embodiment, the bonding pads 640 may overlap with the edge regions of the memory cell arrays 620a and 620b. In an example embodiment, the bonding pads 640 may be at least part of an upper portion of a region of the memory cell arrays 620a and 620b having one or more dummy channels (not shown). However, inventive concepts are not limited thereto.

The connection pads 641 may be disposed between the first and second memory cell arrays 620a and 620b. The connection pads 641 may be contact points electrically connecting the bonding pads 640 and the first pad circuit 650a or the second pad circuit 650b through rewiring. Sizes of the connection pads 641 may be smaller than those of the bonding pads 640 but are not limited thereto.

The first and second pad circuits 650a and 650b may be formed between the substrate 600 and the first memory cell array 620a and between the substrate 600 and the second memory cell array 620b. The pad circuits 650a and 650b may include an ESD circuit, a pull-up/pull-down driver, a data input/output (I/O) circuit, etc.

In the memory device 10e, the first pad circuit 650a may be disposed in a lower portion of one side surface of the first memory cell array 620a adjacent to the connection pads 641, and the second pad circuit 650b may be disposed in a lower portion of the second memory cell array 620b adjacent to the connection pads 641.

The pad circuits 650a and 650b may be electrically connected to the connection pads 641 through a plurality of connection pad contacts (not shown). The connection pad contacts (not shown) may include a metal material. Examples of a metal material used as the connection pad contacts (not shown) may include W, Au, Ag, Cu, Al, TiAlN, WN, Ir, Pt, PD, Ru, Zr, Rh, Ni, Co, Cr, Sn, Zn, etc. The connection pad contacts (not shown) may include the metal material having rigidity suitable for a chemical and mechanical polishing process. For example, the connection pad contacts (not shown) may include tungsten. The connection pad contacts (not shown) may further include a barrier metal layer. The connection pad contacts (not shown) may have a flat upper surface.

The connection pads 641 may include a material different from metal included in the connection pad contacts (not shown). The connection pads 641 may include a material having lower resistance than that of the metal included in the connection pad contacts (not shown). For example, when the connection pad contacts (not shown) include tungsten, the connection pads 641 may include aluminum or an aluminum alloy.

Figure 24:
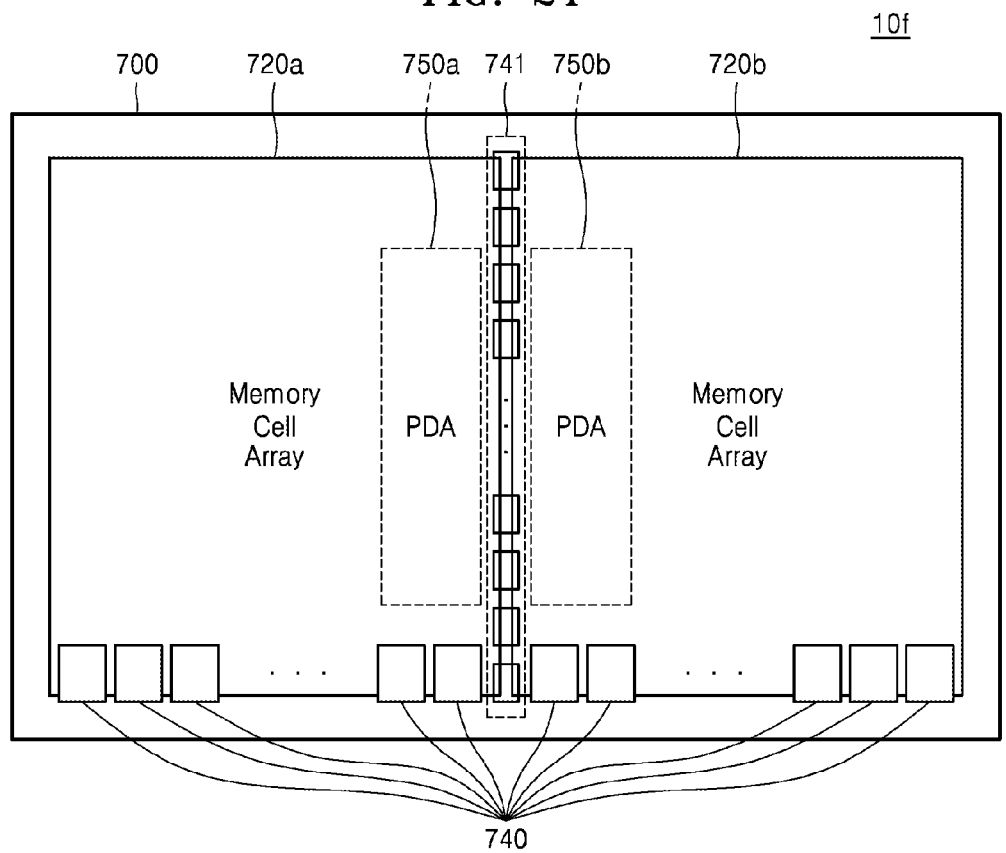
FIG. 24 is a layout diagram of a memory device according to an example embodiment.

FIG. 24 is a layout diagram of a memory device 10f according to an example embodiment.

A layout of the memory device 10f of FIG. 24 is similar to a layout of the memory device 10e of FIG. 23. However, in FIG. 24, connection pads 741 may be disposed on an upper portion of a first memory cell array 720a or a second memory cell array 720b. That is, the connection pads 741 may be formed at a height farther from a substrate 700 than the memory cell arrays 720a and 720b or at the same height as those of the memory cell arrays 720a and 720b in a vertical direction. The connection pads 741 may vertically overlap with the first memory cell array 720a or the second memory cell array 720b. In FIG. 24, the memory device 10f may include first and second pad circuits 750a and 750b, and bonding pads 740.

Figure 25:
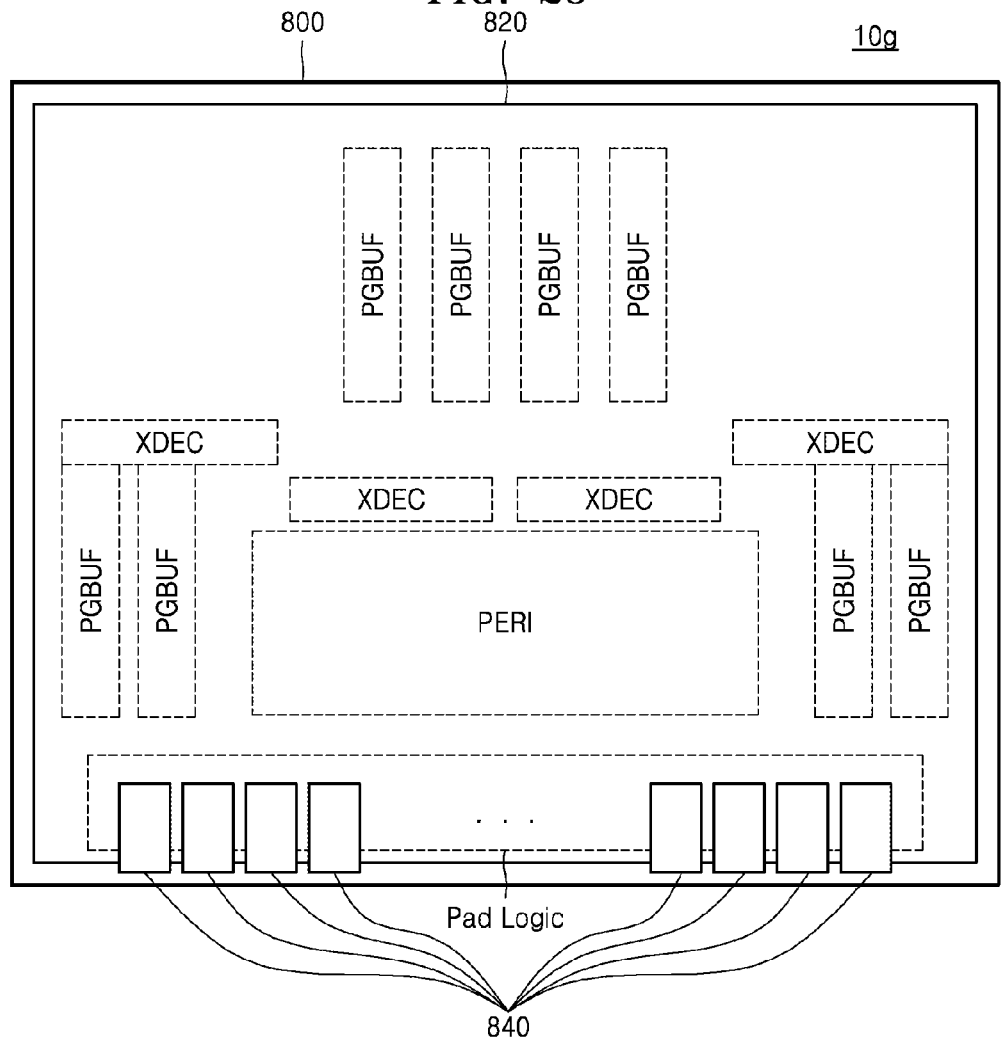
FIG. 25 is a layout diagram of a memory device according to an example embodiment.

FIG. 25 is a schematic diagram of a main configuration of a memory device 10g according to an example embodiment. FIG. 25 illustrates the memory device 10g having a COP circuit structure.

Referring to FIG. 25, various peripheral circuits XDEC, PGBUF, PERI, and PAD LOGIC may be formed on a substrate 800. The peripheral circuits may be disposed according to a location of a memory cell array 820.

A page buffer PGBUF, a row decoder XDEC, and a peripheral circuit PERI may overlap with the memory cell array 820 in a direction (for example, z direction) perpendicular to the substrate 800. The peripheral circuit PERI may include, for example, a latch circuit, a cache circuit, or a sense amplifier. However, this is merely an example and may be changed in various ways.

A pad circuit PAD LOGIC may include an ESD circuit, a pull-up/pull-down driver, or a data input/output (I/O) circuit. As shown in FIG. 25, the pad circuit PAD LOGIC may overlap with the memory cell array 820 in the direction (for example, z direction) perpendicular to the substrate 800.

Bonding pads 840 may overlap with the pad circuit PAD LOGIC in a vertical direction by bonding pad contacts (not shown). That is, at least some of the bonding pads 840 may be disposed on an upper portion of the memory cell array 820, thereby reducing a size of a chip.

Figure 26:
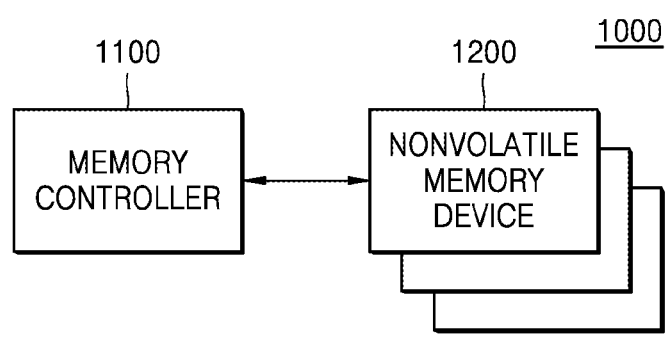
FIG. 26 is a block diagram showing an example of a memory device applied to a memory system according to an example embodiment.

FIG. 26 is a block diagram showing an example of the memory device 10 applied to a memory system 1000 according to an example embodiment.

Referring to FIG. 26, the memory system 1000 may include a memory controller 1100 and a plurality of non-volatile memory devices 1200.

The memory controller 1100 may receive data from a host (not shown) and may store the received data in the plurality of non-volatile memory devices 1200.

The plurality of non-volatile memory devices 1200 may include the memory devices 10, 10a, 10b, 10c, 10d, 10e, 10f, and 10g having a layout structure described with reference to FIGS. 1 through 24.

The memory system 1000 may be mounted in a host such as a computer, a laptop, a cellular phone, a smart phone, an MP3 player, a personal digital assistant (PDA), a portable multimedia player (PMP), a digital TV, a digital camera, a portable game console, etc.

While some example embodiments of inventive concepts have been particularly shown and described, it will be understood that various changes in form and details may be made therein without departing from the spirit and scope of the following claims.

What is claimed is:

1. A non-volatile memory device comprising:
    a substrate;
    a memory cell array on the substrate, the memory cell array including a plurality of gate conductive layers stacked on the substrate in a vertical direction and a plurality of channels penetrating into the plurality of gate conductive layers on an upper portion of the substrate;
    a plurality of bonding pads on at least part of an upper portion of the memory cell array, the plurality of bonding pads being configured to electrically connect the non-volatile memory device to an external device; and
    a pad circuit between the substrate and the memory cell array, the pad circuit being electrically connected to at least one of the plurality of bonding pads.

2. The non-volatile memory device according to claim 1, wherein the plurality of bonding pads are on at least part of an upper portion of an edge region of the memory cell array in which the channels are not disposed.

3. The non-volatile memory device according to claim 1, wherein the plurality of bonding pads are on at least part of an upper portion of a region of the memory cell array in which at least one dummy channel hole is disposed.

4. The non-volatile memory device according to claim 1, further comprising:
    a peripheral circuit configured to write or read data to or from the memory cell array,
    wherein the peripheral circuit is between the substrate and the memory cell array.

5. The non-volatile memory device according to claim 4, wherein the peripheral circuit is on the substrate and adjacent to the pad circuit in a horizontal direction.

6. The non-volatile memory device according to claim 4, wherein the pad circuit includes a data input/output circuit electrically connected between at least one of the plurality of bonding pads and the peripheral circuit.

7. The non-volatile memory device according to claim 4, wherein the pad circuit includes an electrostatic discharge (ESD) circuit electrically connected between at least one of the plurality of bonding pads and the peripheral circuit.

8. The non-volatile memory device according to claim 4, wherein the pad circuit includes a pull-up/pull-down circuit electrically connected between at least one of the plurality of bonding pads and the peripheral circuit.

9. The non-volatile memory device according to claim 1, wherein the pad circuit is on a lower portion of a side surface of the memory cell array adjacent to the plurality of bonding pads.

10. A non-volatile memory device comprising:
    a substrate;
    a first memory cell array on an upper portion of the substrate;
    a second memory cell array on the upper portion of the substrate and adjacent to the first memory cell array;
    a plurality of bonding pads on at least part of an upper portion of at least one of the first memory cell array and the second memory cell array, the plurality of bonding pads being configured to electrically connect the non-volatile memory device to an external device;
    a first pad circuit between the substrate and the first memory cell array;
    a second pad circuit between the substrate and the second memory cell array; and
    a plurality of connection pads electrically connecting at least one of the first pad circuit and the second pad circuit to at least one of the plurality of bonding pads, at least one of the plurality of connection pads being on at least a part of the first memory cell array and a part of the second memory cell array.

11. The non-volatile memory device according to claim 10, wherein the first memory cell array and the second memory cell array are cell arrays having a vertical stack structure extending in the vertical direction with respect to the substrate.

12. The non-volatile memory device according to claim 10, wherein at least one of the plurality of connection pads is on at least part of the upper portion of at least one of the first memory cell array and the second memory cell array, between the first memory cell array and the second memory cell array.

13. The non-volatile memory device according to claim 10, wherein
the first pad circuit is on a lower portion of a side surface of the first memory cell array adjacent to the plurality of connection pads, and
the second pad circuit is on a lower portion of a side surface of the second memory cell array adjacent to the plurality of connection pads.

14. The non-volatile memory device according to claim 10, further comprising:
a peripheral circuit configured to write or read data to or from at least one of the first memory cell array and the second memory cell array, wherein
the peripheral circuit is adjacent to at least one of the first pad circuit and the second pad circuit in a horizontal direction.

15. The non-volatile memory device according to claim 14, wherein the first pad circuit and the second pad circuit each include one of an ESD circuit, a pull-up/pull-down driver, and a data input/output circuit that is electrically connected between the connection pads and the peripheral circuit.

16. A non-volatile memory device comprising:
a substrate;
a memory cell array on the substrate, the memory cell array including a plurality of gate conductive layers stacked on top of each other on a semiconductor layer and a plurality of channels penetrating the plurality of gate conductive layers towards the semiconductor layer in a vertical direction;
a plurality of bonding pads on the substrate over at least part of an upper portion of the memory cell array; and
a pad circuit between the substrate and the memory cell array, the pad circuit being electrically connected to at least one of the plurality of bonding pads.

17. The nonvolatile memory device of claim 16, further comprising:
an insulating thin film between the memory cell array and the substrate; and
a bonding pad contact, wherein
the insulating thin film defines an opening, and
the bonding pad contact extends through the opening to connect one of the at least one of the plurality of bonding pads to the pad circuit.

18. The nonvolatile memory device of claim 17, further comprising:
a common source line extending through the memory cell array in the vertical direction, wherein
the common source line is between the plurality of channels and the bonding pad contact, and
the bonding pad contact is spaced apart from the plurality of gate conductive layers.

19. The nonvolatile memory device of claim 16, further comprising:
a peripheral circuit between the substrate and the memory cell array, wherein
the peripheral circuit is adjacent to the pad circuit.

20. The nonvolatile memory device of claim 16, wherein the plurality of bonding pads are over an edge region of the memory cell array in which the channels are not disposed.

* * * * *